United States Patent
Cho

(10) Patent No.: US 7,851,842 B2
(45) Date of Patent: Dec. 14, 2010

(54) VERTICAL CHANNEL TRANSISTOR IN SEMICONDUCTOR DEVICE AND METHOD OF FABRICATING THE SAME

(75) Inventor: Yun-Seok Cho, Gyeonggi-do (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 12/842,600

(22) Filed: Jul. 23, 2010

(65) Prior Publication Data

US 2010/0283102 A1    Nov. 11, 2010

Related U.S. Application Data

(62) Division of application No. 12/346,671, filed on Dec. 30, 2008, now Pat. No. 7,785,960.

(30) Foreign Application Priority Data

Mar. 25, 2008    (KR) .................... 10-2008-0027425

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl. ............... 257/302; 257/328; 257/E27.057; 257/E27.096

(58) Field of Classification Search .................. 257/302, 257/328, 329, 331, E27.057, E27.096

See application file for complete search history.

(56) References Cited

U.S. PATENT DOCUMENTS

| 6,104,061 A | 8/2000 | Forbes et al. |
| 6,150,688 A | 11/2000 | Maeda et al. |
| 7,531,412 B2 * | 5/2009 | Yoon et al. .................. 438/270 |

FOREIGN PATENT DOCUMENTS

| KR | 1020060041415 | 5/2006 |
| KR | 100660881 | 12/2006 |
| KR | 1020070038233 | 4/2007 |

OTHER PUBLICATIONS

Korean Notice of Allowance for application No. 10-2008-0027425, citing the attached reference(s).
Korean Office Action for application No. 10-2008-0027425, citing the attached reference(s).

* cited by examiner

*Primary Examiner*—Hoai v Pham
(74) *Attorney, Agent, or Firm*—Lowe Hauptman Ham & Berner LLP

(57) ABSTRACT

A method of fabricating a vertical channel transistor for a semiconductor device includes forming, on a substrate, a plurality of active pillars each having a gate electrode formed on and surrounding a lower portion thereof; forming a first insulation layer over the active pillars to fill a gap region between the active pillars; partially removing the first insulation layer to exposes a circumferential surface of the gate electrode in all directions, without exposing the substrate in the gap region between the active pillars; forming a conductive layer on the remaining first insulation layer to fill the gap region between the active pillars; and patterning the conductive layer to form a word line that surrounds and contacts the circumferential surface of the gate electrode in all directions.

3 Claims, 35 Drawing Sheets

US 7,851,842 B2

VERTICAL CHANNEL TRANSISTOR IN SEMICONDUCTOR DEVICE AND METHOD OF FABRICATING THE SAME

CROSS-REFERENCE TO RELATED APPLICATIONS

The present application claims priority to Korean patent application number 2008-0027425, filed on Mar. 25, 2008, and is a divisional of U.S. Ser. No. 12/346,671, filed on Dec. 30, 2008, which is incorporated herein by reference in its entirety.

BACKGROUND

The disclosure relates to a vertical channel transistor in a semiconductor device and a method of fabricating the same, and more particularly, to a vertical channel transistor in a semiconductor device which can reduce resistance of a word line, and a method of fabricating the same.

As semiconductor devices become highly integrated, their cell area on a wafer is decreased. Since a transistor of a Giga-bit Dynamic Random Access Memory (DRAM) device requires a unit cell pitch of $4F^2$ (where F is the minimum feature size), a vertical channel transistor is provided in order to improve cell efficiency by increasing the integration degree of the DRAM device and securing an acceptable channel length of the transistor.

FIG. 1 is a perspective view of a semiconductor device having a vertical channel transistor of a type known to the inventor(s).

Referring to FIG. 1, the known vertical channel transistor includes a plurality of active pillars 190 vertically protruding from a semiconductor substrate 100. The active pillars 190 are formed by etching the semiconductor substrate 100 using a hard mask pattern (not shown) as an etch mask, and are arranged in a first direction A-A' and a second direction B-B' that crosses the first direction.

An impurity region (not shown) is formed by implanting impurities into regions between the active pillars 190 in the semiconductor substrate 100. An upper region and a lower region of the active pillar 190 are defined as a source region and a drain region, respectively. A channel region is vertically located in the active pillar 190 between the source region and the drain region. A bit line 110 is formed by dividing the impurity region through a device isolation trench 191, which extends in the second direction B-B' of the semiconductor substrate 100. Also, a word line 193 is formed to electrically connect gate electrodes (not shown), which surround lower sidewalls of the active pillars 190, and extends in the first direction A-A'.

A storage electrode 195 is formed over the active pillar 190, and a contact plug 194 may be interposed between the active pillar 190 and the storage electrode 195.

FIGS. 2A to 7C illustrate a method of fabricating a vertical channel transistor in a semiconductor device as known to the inventor(s). Particularly, FIGS. 2A, 3A, 4A, 5A, 6A and 7A represent plan views of the semiconductor device being fabricated through multiple steps. FIGS. 2B, 3B, 4B, 5B, 6B and 7B represent cross-sectional views of FIGS. 2A, 3A, 4A, 5A, 6A and 7A taken along a cross-sectional line in the first direction A-A', respectively. FIGS. 2C, 3C, 4C, 5C, 6C and 7C represent cross-sectional views of FIGS. 2A, 3A, 4A, 5A, 6A and 7A taken along a cross-sectional line in the second direction B-B', respectively.

Referring to FIGS. 2A to 2C, an upper portion of an active pillar 190 is formed by etching a substrate 100 to a first predetermined depth using a hard mask nitride layer 101 as an etch mask. A pad oxide layer 102 may be interposed between the substrate 100 and the hard mask nitride layer 101. A spacer 103 is formed to protect sidewalls of the hard mask nitride layer 101, the pad oxide layer 102 and the upper portion of the active pillar 190. A lower portion of the active pillar 190 is formed by etching the substrate 100 to a second predetermined depth, which is greater than the first predetermined depth, using the hard mask nitride layer 101 and the spacer 103 as an etch barrier. The lower portion of the active pillar 190 is still connected with the upper portion of the active pillar 190 as a single body. An isotropic etching process is performed on the exposed substrate 100 in such a manner that the width of the active pillar 190 in the lower portion is narrower than the width of the active pillar 190 in the upper portion.

A gate insulation layer 104 is formed over the substrate 100 exposed by the hard mask nitride layer 101 and the spacer 103, and a gate electrode 105 surrounding the lower portion of the active pillar is formed. An impurity region for bit line formation is formed by implanting ion impurities into the substrate 100 between the active pillars 190.

An etch stop layer 106 is formed over the resultant structure including the gate electrode 105. A bottom of a gap region between the active pillars 190 is etched to a predetermined depth in the second direction to form a device isolation trench. Thus, the device isolation trench divides the impurity region to form a bit line 110. A first insulation layer 107 is formed over the resultant structure to fill the gap region between the active pillars 190.

A line-type mask pattern 112 is formed over the resultant structure to expose a line of the active pillars 190 arranged in the first direction. A spacing in the second direction between the adjacent mask patterns 112 is formed to be narrower than a width in the second direction of the active pillar 190.

Referring to FIGS. 3A to 3C, the first insulation layer 107 is etched by using the mask pattern 112 as an etch mask. The first insulation layer 107 is etched from the top surface thereof as shown in FIG. 2B to 2C, beyond the uppermost part of the gate electrode 105, down to a level lower by a predetermined height (FIG. 3B), and the first insulation layer 107 remains in the gap region between the active pillars 190 (FIG. 3C). In the etching process of the first insulation layer 107, the hard mask nitride layer 101 formed on the active pillar 190 may be damaged.

Referring to FIGS. 4A to 4C, the portion of the etch stop layer 106 that is exposed due to the etching process of the first insulation layer 107 is removed, and a word line trench is formed. The word line trench exposes the gate electrode 105 surrounding sidewalls of the lower region of the active pillar 190. As shown in FIG. 4A, only the portions of the etch stop layer 106 that are exposed by the mask pattern 112 is removed. Thus, not the whole gate electrode 105, but only a portion thereof, is exposed. In the process of removing the etch stop layer 106, the hard mask nitride layer 101 formed on the active pillar 190 may be further damaged.

As shown in FIGS. 5A to 5C, a conductive layer 108 is deposited over the resultant structure.

Referring to FIGS. 6A to 6C, an etch-back process is performed on the conductive layer 108 to a level of the uppermost part of the gate electrode 105, thereby forming word lines 108A. Each of the word lines 108A electrically connects the gate electrodes 105 of neighboring active pillars 190 and extends in the first direction. In the etch-back process of the conductive layer 108, the hard mask nitride layer 101 formed on the active pillar 190 may be damaged further.

Referring to FIGS. 7A to 7C, a second insulation layer 109 is deposited over the resultant structure including the word lines 108A to fill the gap region between the active pillars 190. Subsequently, the upper region of the active pillar 190 is exposed by removing the overlying portion of the second insulation layer 109 and the hard mask nitride layer 101. Then, a contact plug, e.g., 194 in FIG. 1, and a storage electrode, e.g., 195 in FIG. 1, are formed in the recited order over the exposed active pillar 190.

Resistance of the word line 108A as formed by the known method is disadvantageously large. Specifically, the conductive layer 108 is formed over the word line trench formed by removing portions of the etch stop layer 106, which are exposed by the selective etching of the first insulation layer 107. Thus, in a part 150 (FIG. 6A) where the etch stop layer 106 remains, the word line 108A cannot be connected to the gate electrode 105 surrounding the lower region of the active pillar 190. The contact area between the word line 108A and the gate electrode 105 is less than 360 degrees circumferentially of the gate electrode 105, and therefore, resistance of the word line 108A becomes disadvantageously large.

Also, at the formation of the word line trench (see FIGS. 3A to 3C), selectively removing of the etch stop layer 106 (see FIGS. 5A to 5C), and etch-back process of the conductive layer 108 (see FIGS. 6A to 6C), a large amount of the hard mask nitride layer 101 on the active pillar 190 is damaged. When the hard mask nitride layer 101 is damaged, the active pillar 190 below the hard mask nitride layer 101 is exposed and the active pillar may be damaged.

Meanwhile, when the hard mask nitride layer 101 is deposited thickly to prevent exposure of the active pillar 190 due to excessive damage to the hard mask nitride layer 101, the active pillar 190 may be collapsed due to the increased weight of the thick hard mask nitride layer 101. Also, there is a limitation to the increase of the thickness of the hard mask nitride layer 101 in consideration of the integration degree of the semiconductor device.

SUMMARY

In accordance with an aspect, a method of fabricating a vertical channel transistor for a semiconductor device includes: forming, on a substrate, a plurality of active pillars each having a gate electrode formed on and surrounding a lower portion thereof; forming a first insulation layer over the active pillars to fill a gap region between the active pillars; partially removing the first insulation layer to exposes a circumferential surface of the gate electrode in all directions, without exposing the substrate in the gap region between the active pillars; forming a conductive layer on the remaining first insulation layer to fill the gap region between the active pillars; and patterning the conductive layer to form a word line that surrounds and contacts the circumferential surface of the gate electrode in all directions.

In accordance with another aspect, a semiconductor device having a vertical channel transistor includes: a substrate; a plurality of active pillars on the substrate, each said active pillar having a gate electrode formed on and surrounding a lower portion thereof, the active pillars being arranged in a number of rows and columns; and a word line extending along one of the rows, and contacting and surrounding, in full 360 degrees, a circumferential surface of the gate electrode of each of the active pillars in the row.

In accordance with a further aspect, a method of fabricating a vertical channel transistor on a substrate having thereon a plurality of active pillars each having a gate electrode formed on and surrounding a lower portion thereof, includes: forming an insulation layer over the active pillars to fill a gap region between the active pillars; partially removing the insulation layer to expose, in full 360 degrees, a circumferential surface of the gate electrode, without exposing the substrate in the gap region between the active pillars; and forming a word line that surrounds and contacts the circumferential surface of the gate electrode in full 360 degrees.

DESCRIPTION OF EMBODIMENTS

Figure 1:
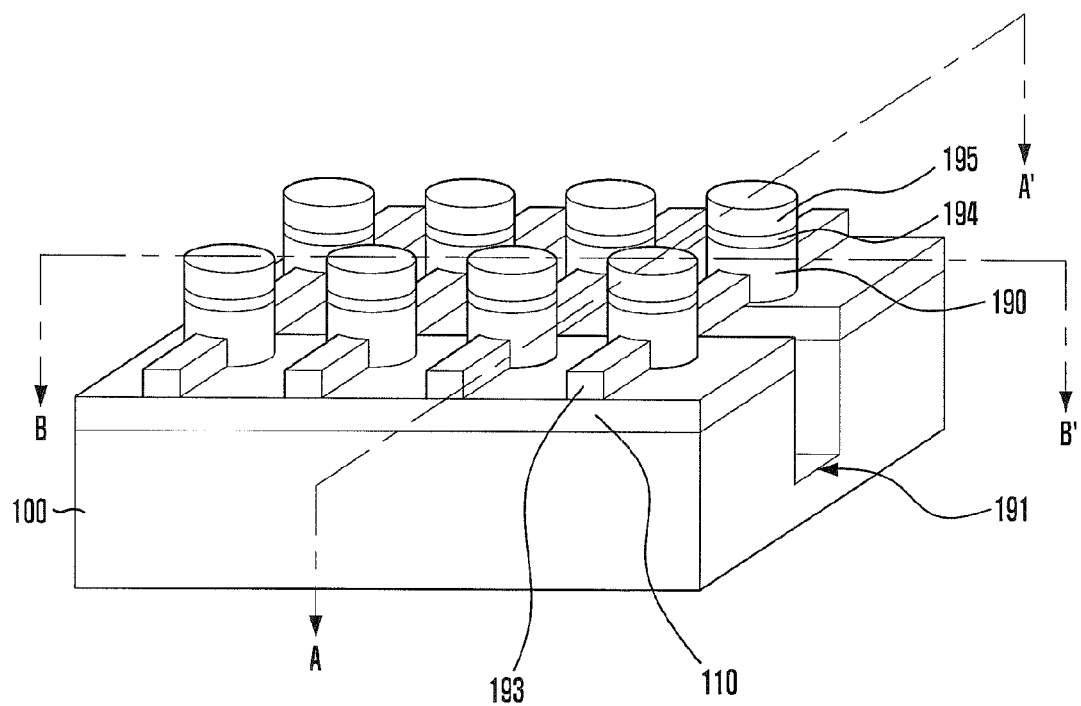
FIG. 1 is a perspective view of a known semiconductor device having a vertical channel transistor.

Hereinafter, a vertical channel transistor in a semiconductor device and a method for forming the same in accordance with the present invention will be described in detail with reference to the accompanying drawings.

In the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. In addition, when a layer is referred to as being 'between' two layers, it can be the only layer between the two layers, or one or more intervening layers may also be present. Furthermore, the same or like reference numerals represent the same or like elements throughout the drawings.

FIGS. 8A to 18C illustrate a method of fabricating a vertical channel transistor in a semiconductor device in accordance with a first embodiment. Particularly, FIGS. 8A, 9A, 10A, 11A, 12A, 13A, 14A, 15A, 16A, 17A and 18A represent plan views of the semiconductor device being fabricated through multiple steps. FIGS. 8B, 9B, 10B, 11B, 12B, 13B, 14B, 15B, 16B, 17B and 18B represent cross-sectional views of FIGS. 8A, 9A, 10A, 11A, 12A, 13A, 14A, 15A, 16A, 17A and 18A taken along a cross-sectional line in the first direction A-A', respectively. FIGS. 8C, 9C, 10C, 11C, 12C, 13C, 14C, 15C, 16C, 17C and 18C represent cross-sectional views of FIGS. 8A, 9A, 10A, 11A, 12A, 13A, 14A, 15A, 16A, 17A and 18A taken along a cross-sectional line in the second direction B-B', respectively.

Figure 8A:
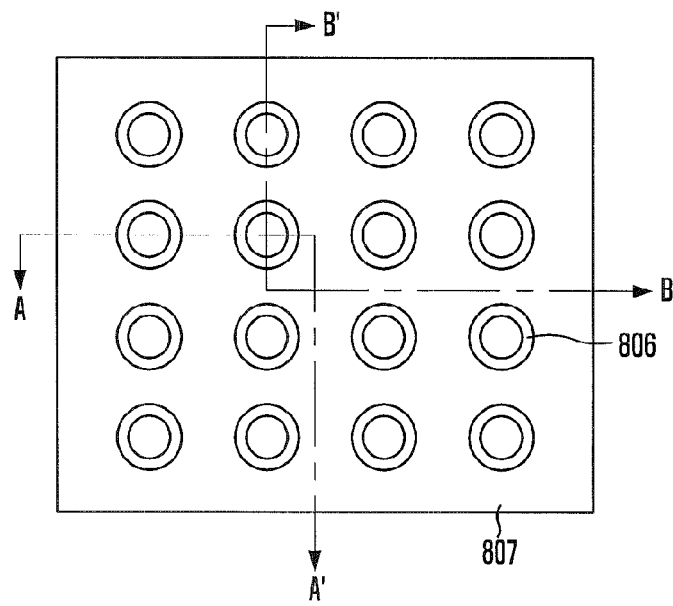
FIGS. 8A to 18C illustrate a method of fabricating a vertical channel transistor in a semiconductor device in accordance with a first embodiment.
Figure 8B:
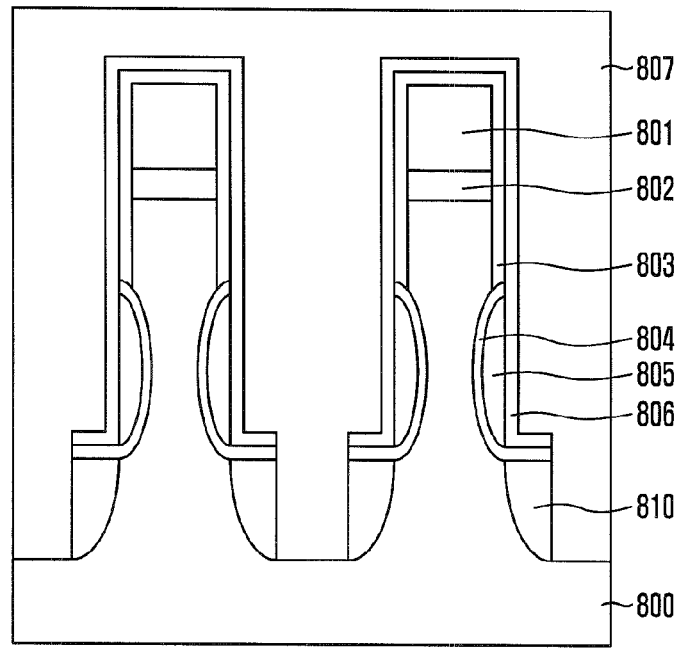
Figure 8C:
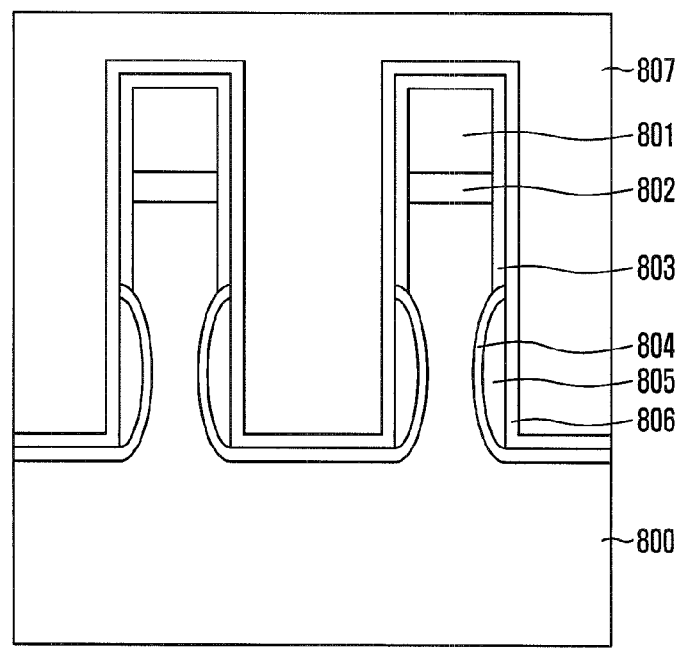

Referring to FIGS. 8A to 8C, an upper portion of an active pillar is formed by etching a substrate 800 to a first predetermined depth using a hard mask nitride layer 801 as an etch mask. A pad oxide layer 802 may be interposed between the substrate 800 and the hard mask nitride layer 801. A spacer 803 is formed to prevent sidewalls of the hard mask nitride layer 801, the pad oxide layer 802 and the upper portion of the active pillar. A lower portion of the active pillar is formed by etching the substrate 800 to a second predetermined depth, which is greater than the first predetermined depth, using the hard mask nitride layer 801 and the spacer 803 as an etch barrier. The lower portion of the active pillar is still connected with the upper portion of the active pillar as a single body. The active pillars are arranged in a first direction A-A' and a second direction B-B' crossing the first direction A-A'. An isotropic etching process is performed on the exposed substrate 800, and then the width in the lower portion of the active pillar becomes narrower than the width in the upper portion of the active pillar.

A gate insulation layer 804 is formed over the exposed substrate 800 by the hard mask nitride layer 831 and the spacer 803, and a gate electrode 805 surrounding the lower portion of the active pillar is formed. The gate electrode 805 may be a polysilicon or a metal.

Subsequently, an impurity region for bit line formation is formed by ion implanting impurities into the substrate 800 between the active pillars. An etch stop layer 806 is formed over the resultant structure including the gate electrode 805. A bottom of a gap region between the active pillars is etched in the second direction to a predetermined depth to form a device isolation trench. Thus, the device isolation trench divides the impurity region to form a bit line 810. A first insulation layer 807 is formed over the resultant structure to fill the gap region between the active pillars. The first insulation layer 807 may be an oxide layer.

Figure 9A:
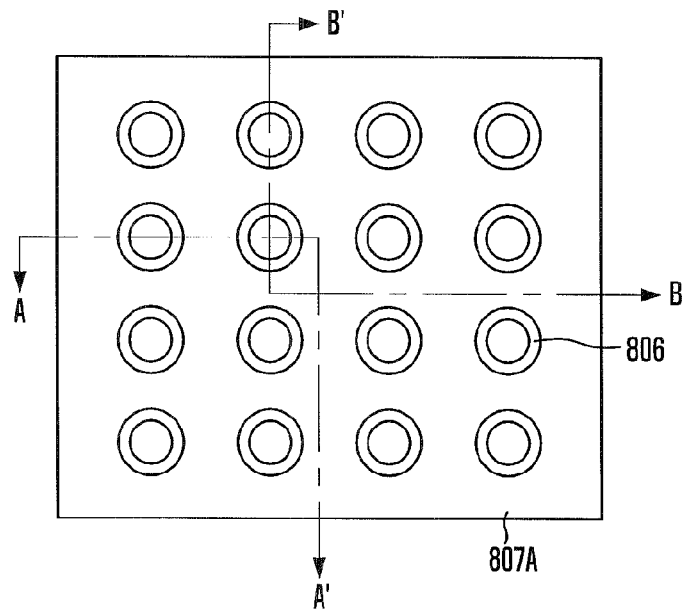
Figure 9B:
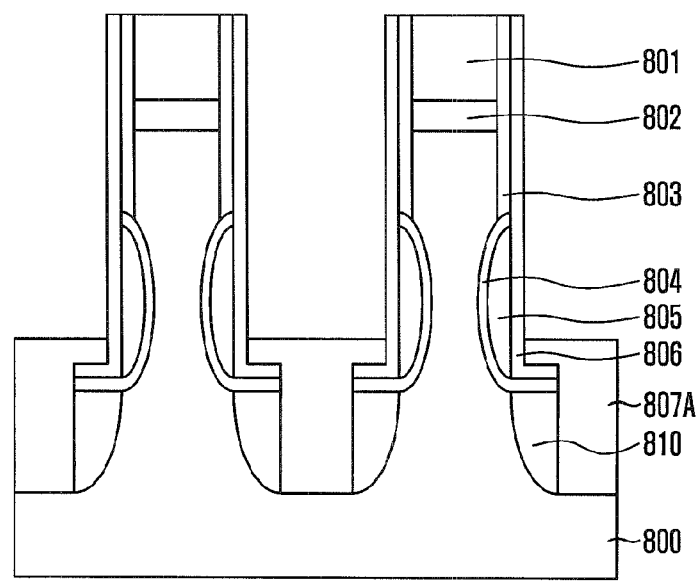
Figure 9C:
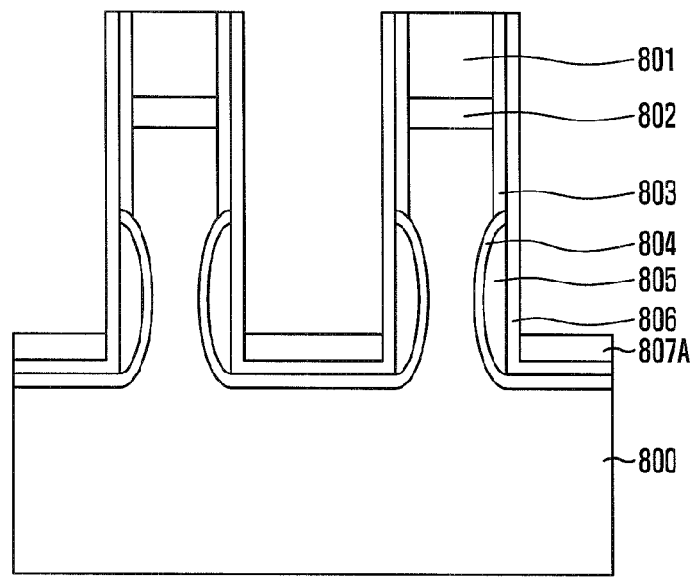

Referring to FIGS. 9A to 9C, a portion of the first insulation layer 807 is removed in such a manner that a bottom of the gap region between the active pillars is not exposed, and the remaining first insulation layer is denoted as 807A. For this purpose, an etch-back process is performed on the first insulation layer 807 from the top surface thereof as shown in FIGS. 8B to 8C, beyond the uppermost part of the gate electrode 805 down to a level lower by a predetermined height, and the etch stop layer 806 is exposed.

In the partial removal of the first insulation layer 807 according to an embodiment, the first insulation layer 807 between the hard mask nitride layers 801 is removed without a separate mask. Therefore, the formation of a word line in some embodiments is different from that of the known art.

Since the partial removal of the first insulation layer 807 is performed through an etch-back process without a separate mask, there is no need to consider an etching profile. The etch-back process is performed to have high etch selectivity of the first insulation layer 807 with respect to the hard mask nitride layer 801. Etching conditions for partially removing the first insulation layer 807 to minimize damages to the hard mask nitride layers 801 will be described herein below.

Figure 10A:
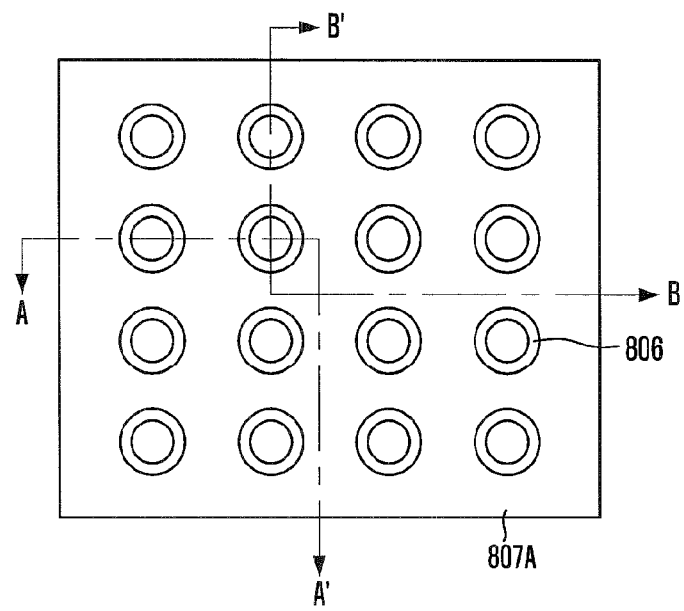
Figure 10B:
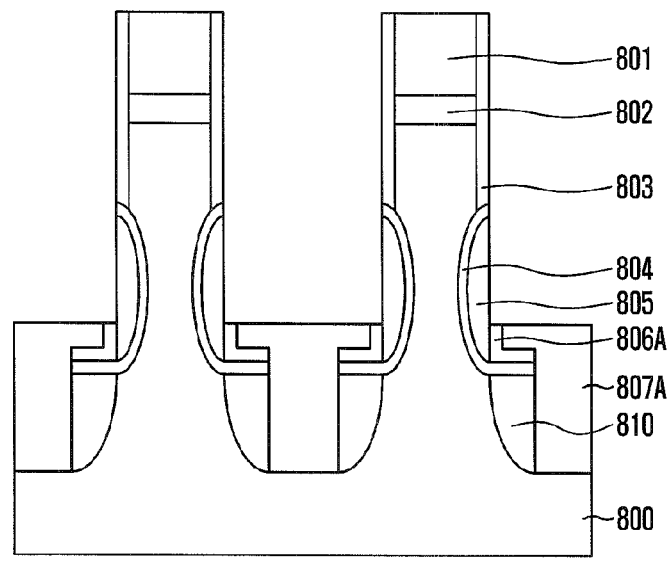
Figure 10C:
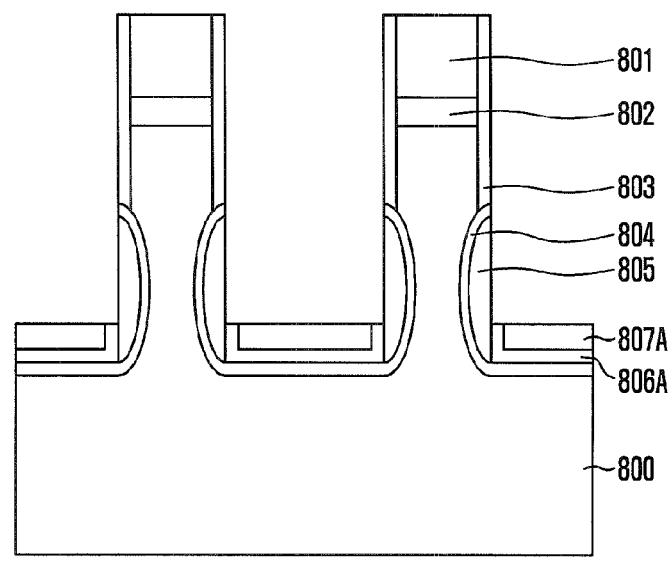

Referring to FIGS. 10A to 10C, a portion of the etch stop layer 806 that is exposed from the remaining first insulation layer 807A is removed, and thus the circumferential surface of the gate electrode 805 surrounding the active pillar is exposed in all directions, i.e., for full 360 degrees. In some embodiments, the whole circumferential surface of the gate electrode 805 is exposed. The remaining etch stop layer is denoted as 806A.

Figure 11A:
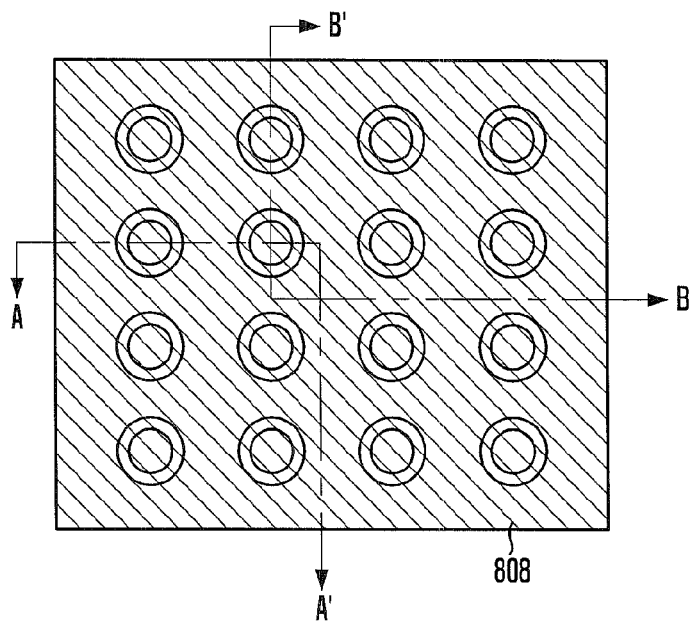
Figure 11B:
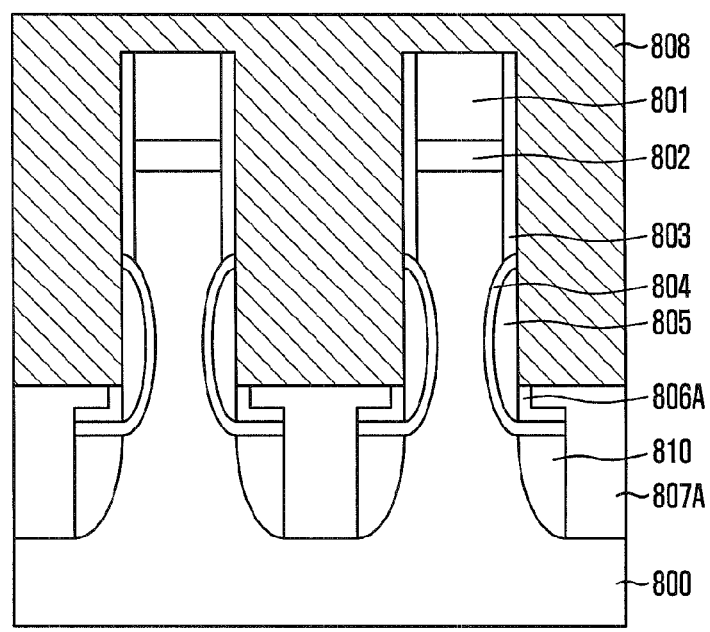
Figure 11C:
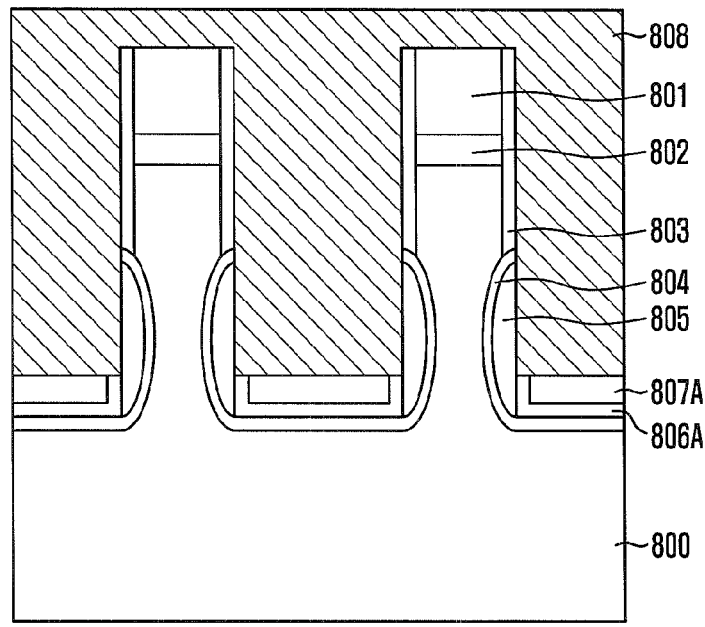

Referring to FIGS. 11A to 11C, a conductive layer 808 is deposited over the resultant structure to subsequently form a word line. The conductive layer 808 may be a polysilicon and/or a metal, and the conductive layer 808 surrounds and contacts the exposed circumferential surface of the gate electrode 805 in full 360 degrees. In some embodiments, the conductive layer 808 surrounds and contacts the whole circumferential surface of the gate electrode 805.

Figure 12A:
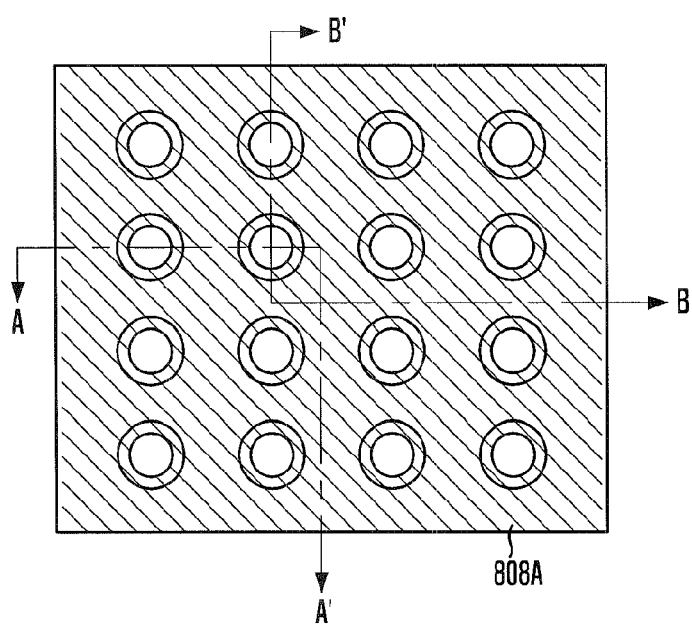
Figure 12B:
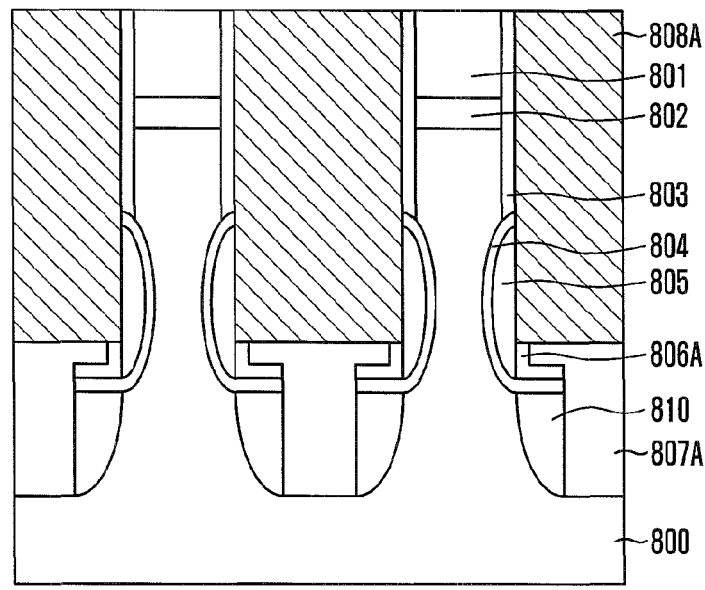
Figure 12C:
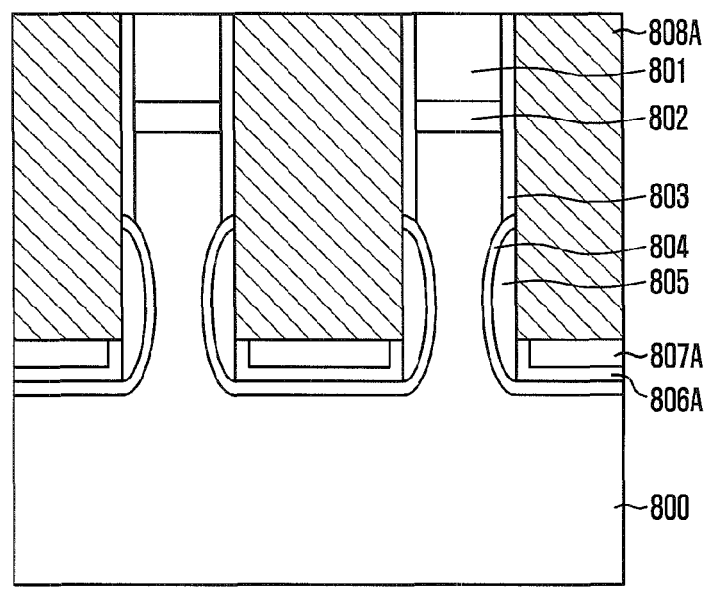

Referring to FIGS. 12A to 12C, the conductive layer 808 is planarized until the hard mask nitride layer 801 is exposed. The planarized conductive layer is denoted as 808A. The planarization process in some embodiments includes a Chemical Mechanical Polishing (CMP) process.

Figure 13A:
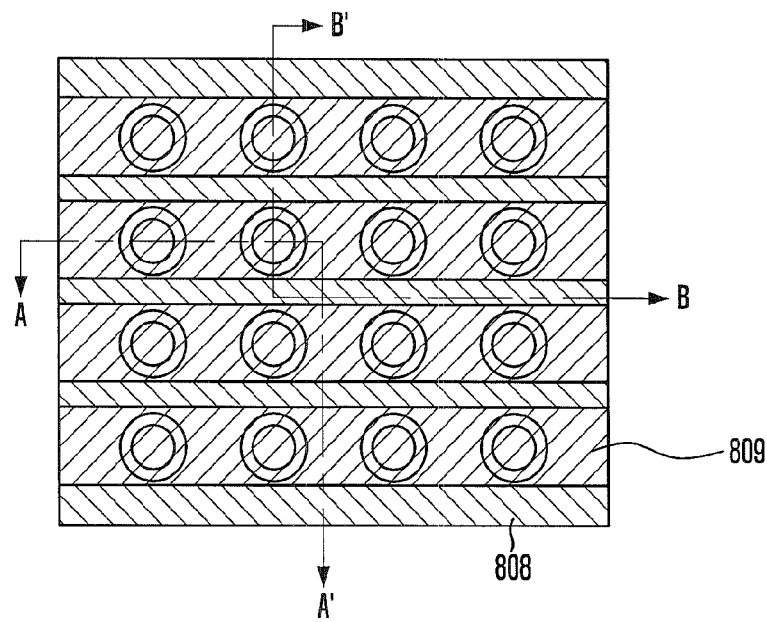
Figure 13B:
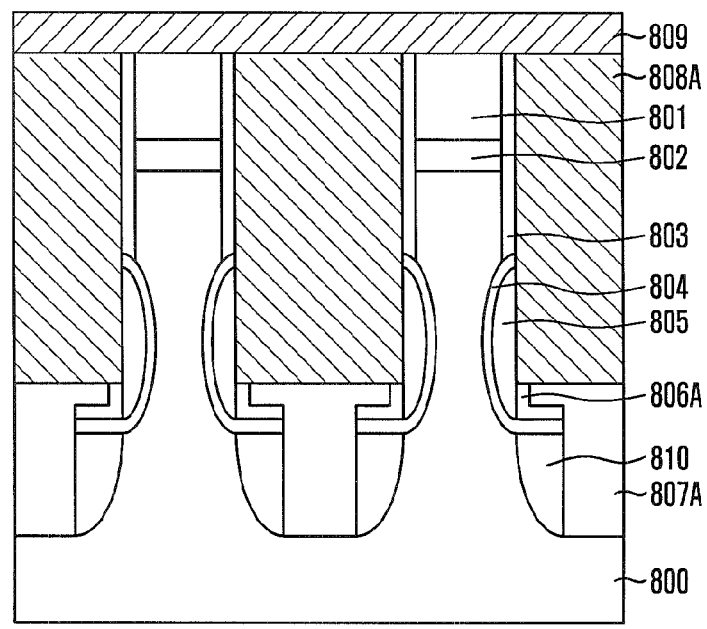
Figure 13C:
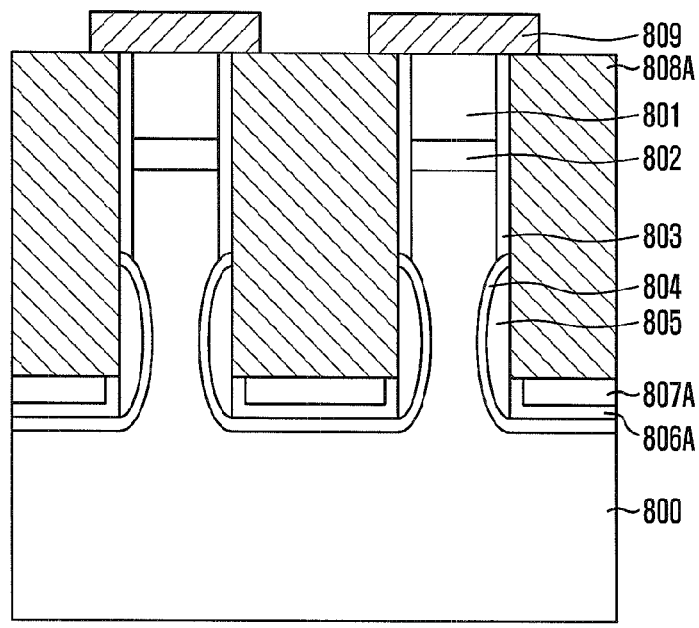

Referring to FIGS. 13A to 13C, a line-type mask pattern 809 covering lines of the active pillars in the first direction is formed over the resultant structure having the planarized conductive layer 808A. The mask pattern 809 has a width larger than a diameter of the active pillar.

Figure 14A:
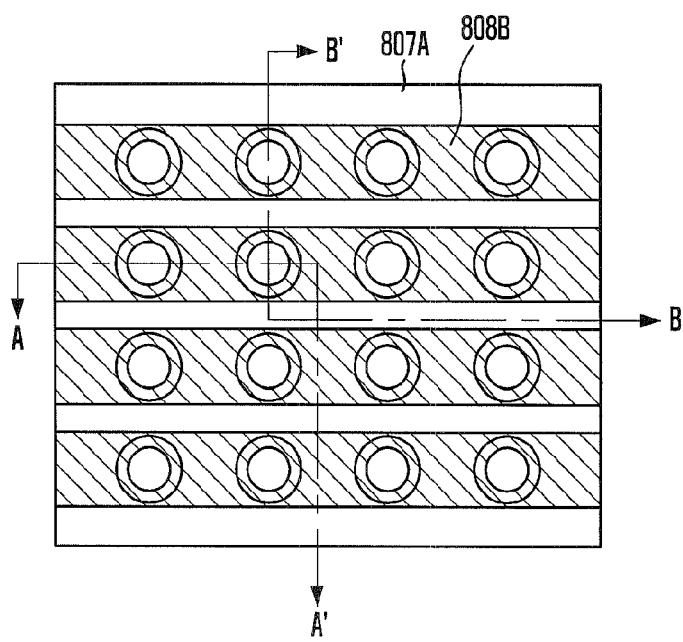
Figure 14B:
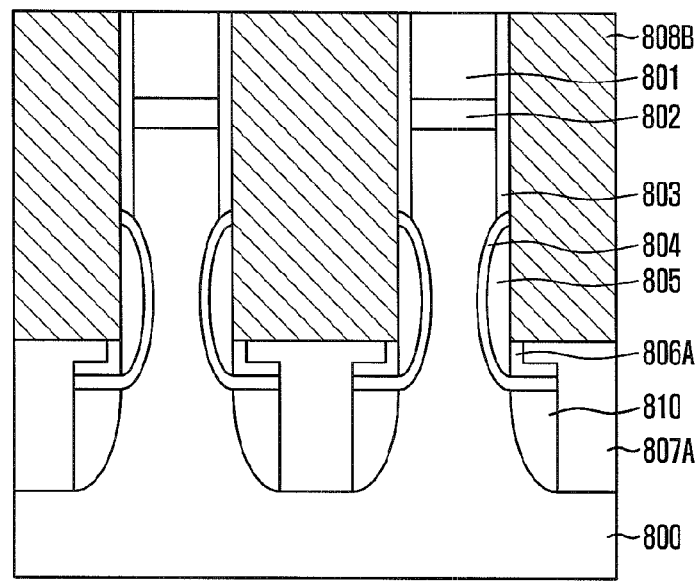
Figure 14C:
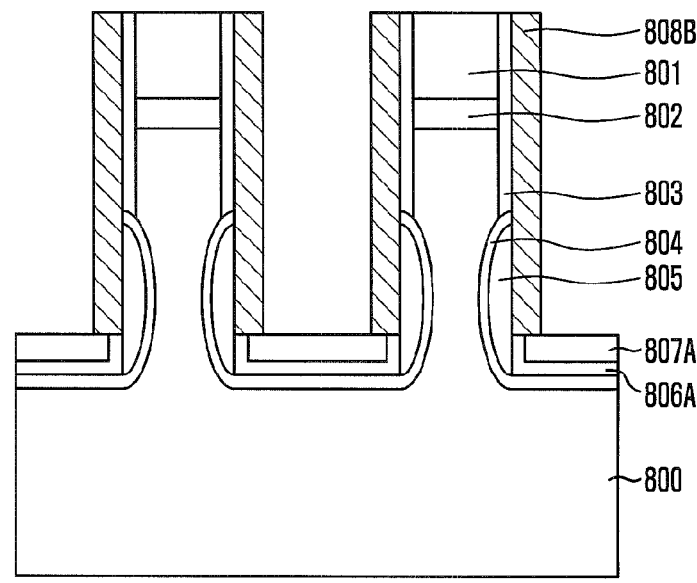

Referring to FIGS. 14A to 14C, the planarized conductive layer 808A is etched using the mask pattern 809 as an etch mask. The etched conductive layer is denoted as 808B. During the etching process of the planarized conductive layer 808A, since the hard mask nitride layer 801 is protected by the mask patterns 809, the hard mask nitride layer 801 may not be damaged.

Figure 15A:
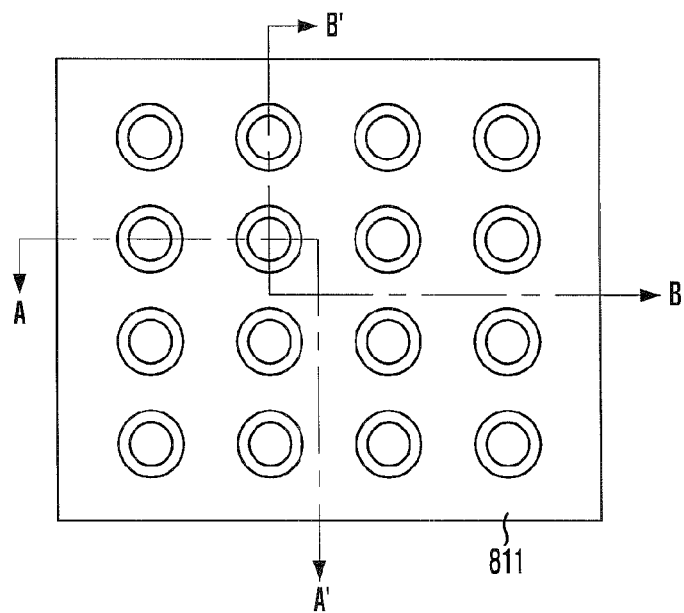
Figure 15B:
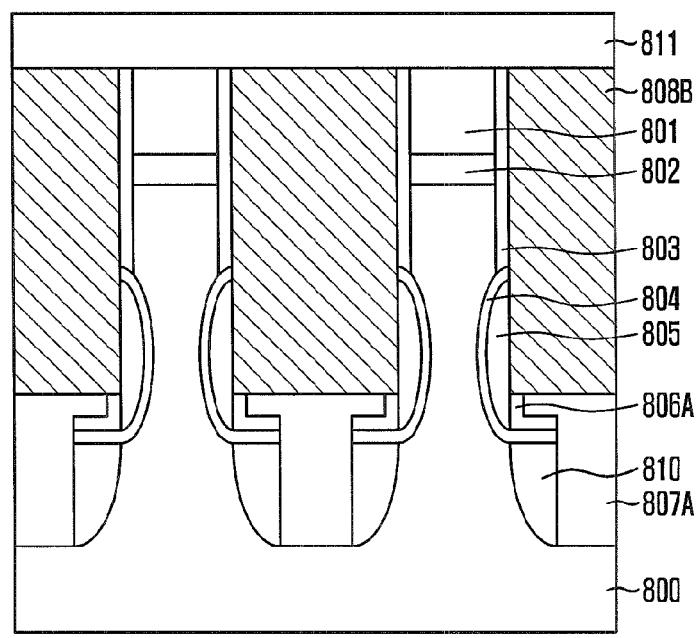
Figure 15C:
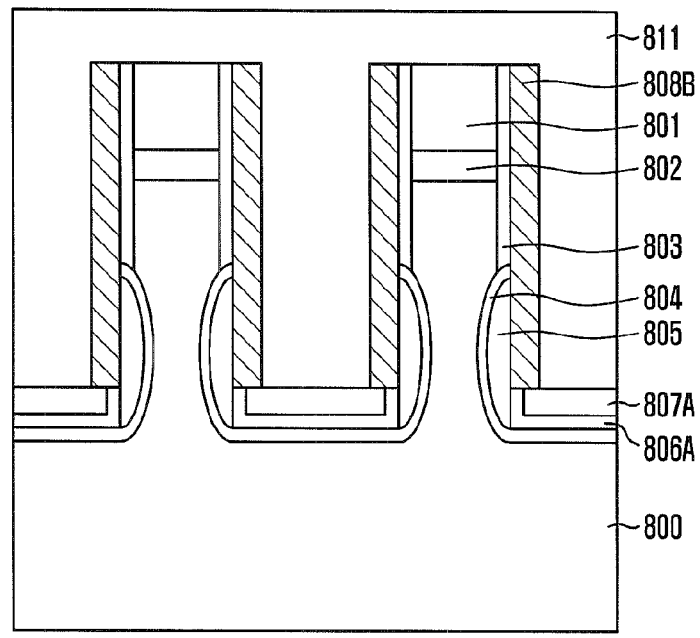

Referring to FIGS. 15A to 15C, a second insulation layer 811 is deposited over the resultant structure to fill the gap region between the active pillars.

Figure 16A:
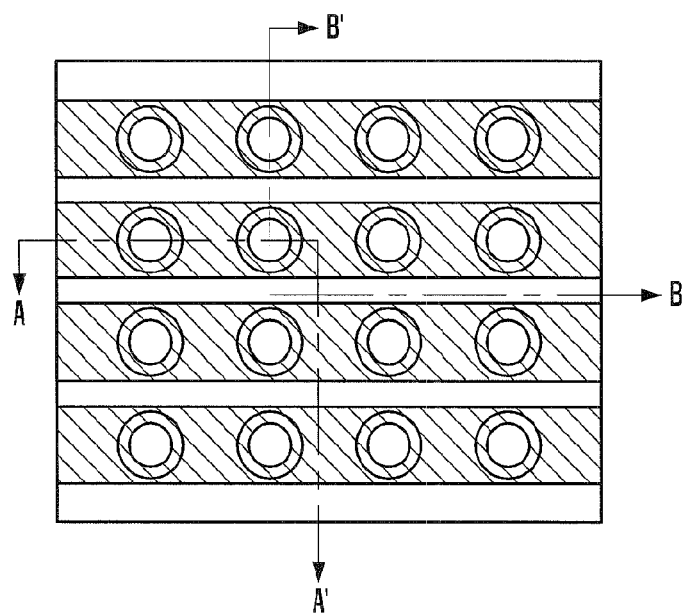
Figure 16B:
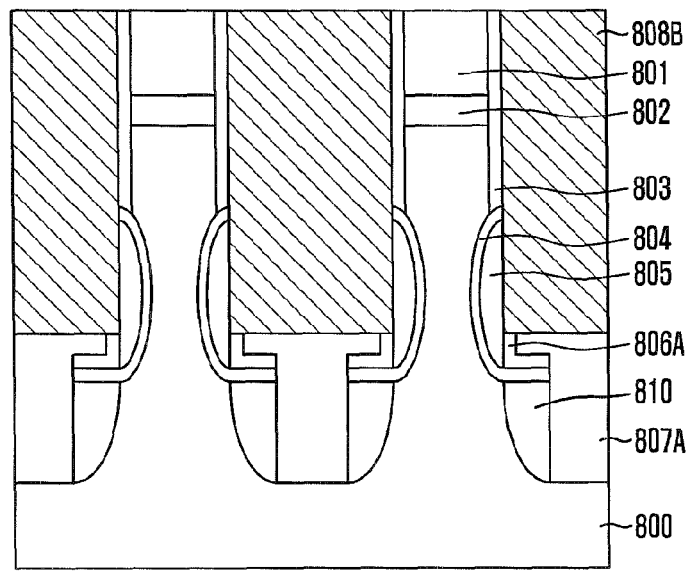
Figure 16C:
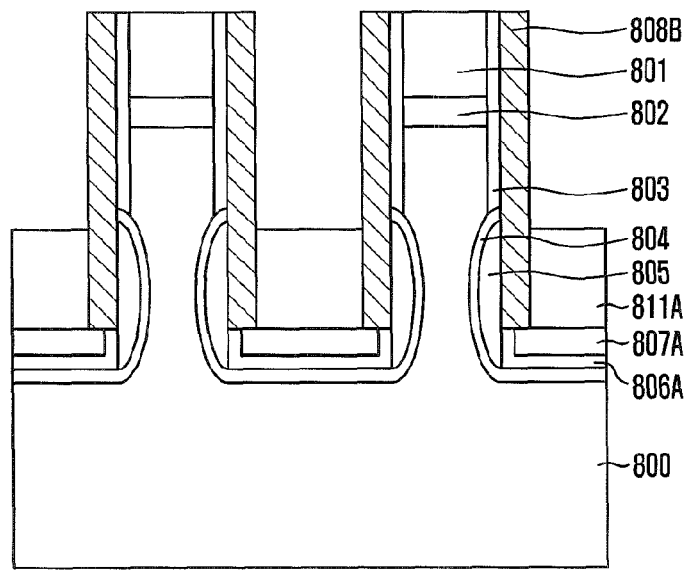

Referring to FIGS. 16A to 16C, an etch-back process is performed on the second insulation layer 811 to a level of the uppermost part of the gate electrode 805. The etched conductive layer 808B, which covers the upper region of the active pillar, is exposed through the etch-back process of the second insulation layer 811.

Thus, the etch-back process of the second insulation layer 811 is performed under a high etch selectivity of the second insulation layer 811 with respect to the hard mask nitride layer 801. Etching conditions of the second insulation layer 811 will be described herein below.

Figure 17A:
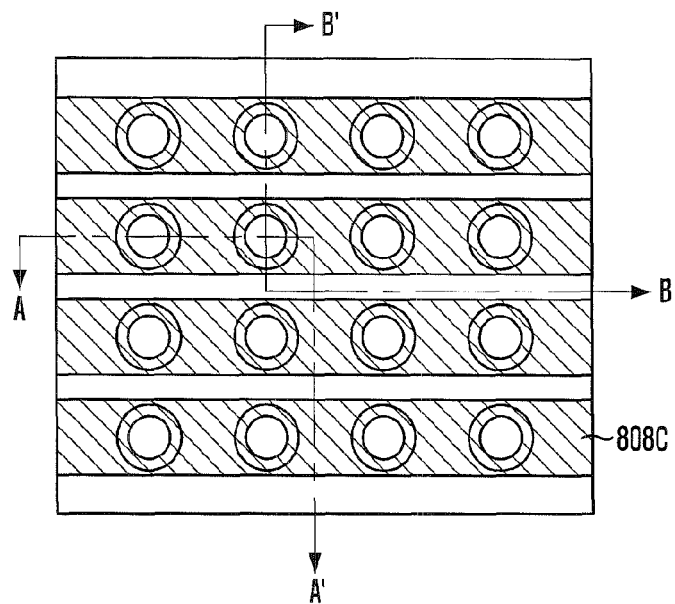
Figure 17B:
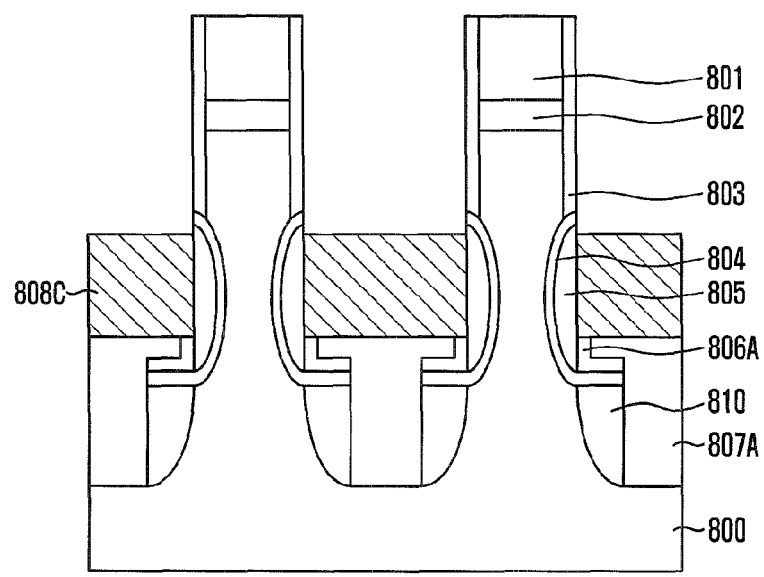
Figure 17C:
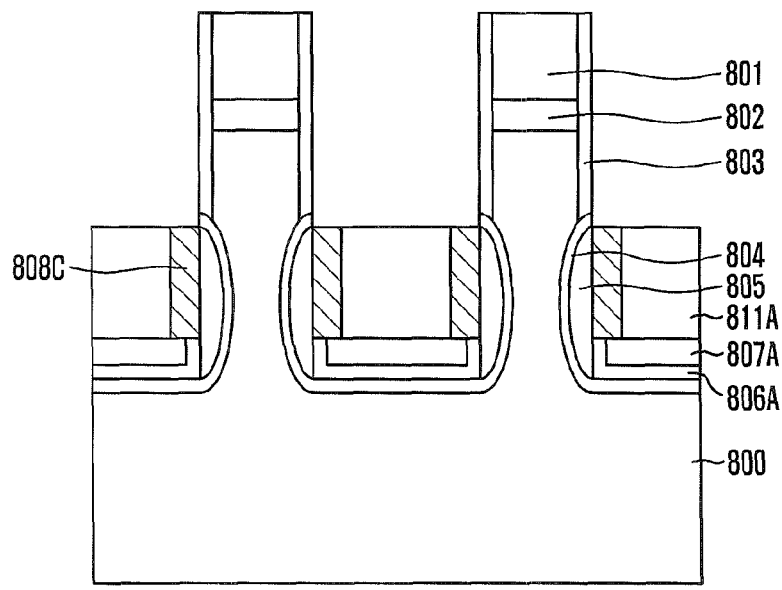

Referring to FIGS. 17A to 17C, an etch-back process is performed on the etched conductive layer 808B to a level of the uppermost part of the gate electrode 805. Thus, a conductive line 808C is formed to surround and contact the circumferential surface of the gate electrode 805 in full 360 degrees and to extend in the first direction. In some embodiments, the conductive layer 808C surrounds and contacts the whole circumferential surface of the gate electrode 805.

Hereinafter, the conductive line 808C will be referred to as a word line.

Figure 18A:
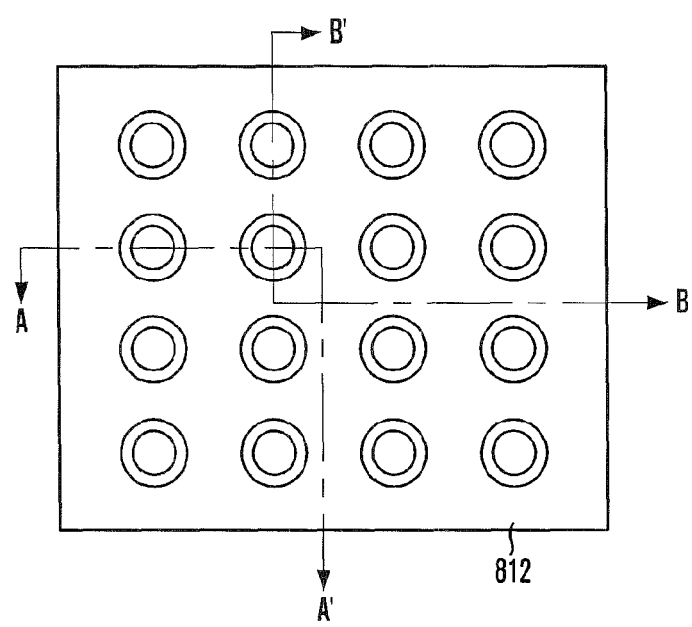
Figure 18B:
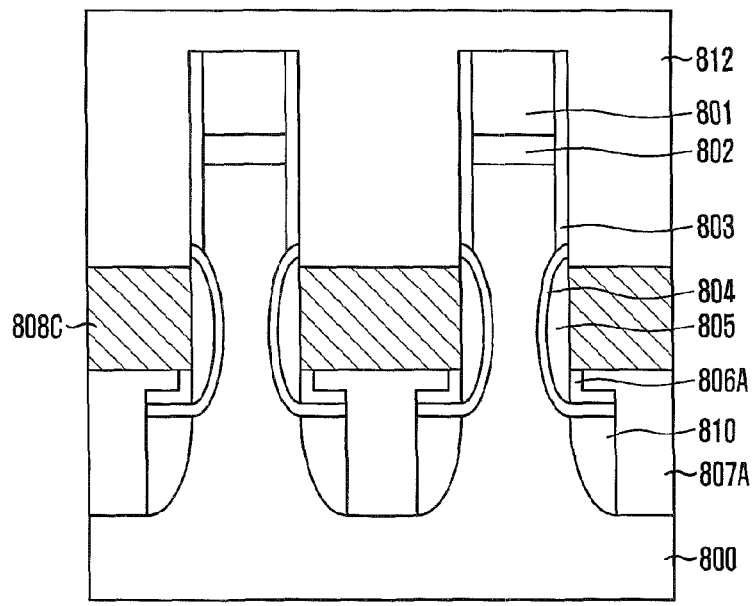
Figure 18C:
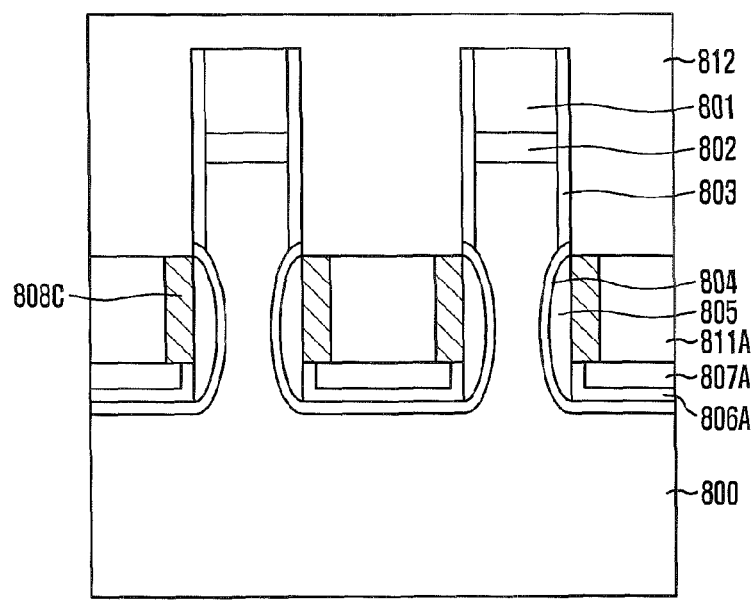

Referring to FIGS. 18A to 18C, a third insulation layer 812 is deposited over the resultant structure including the word line 808C.

Subsequently, although it is not shown in drawings, the upper region of the active pillar is exposed by removing the overlying portion of the third insulation layer 812 and the hard mask nitride layer 801. Then, a contact plug and a storage electrode are formed over the exposed active pillar.

Figure 2A:
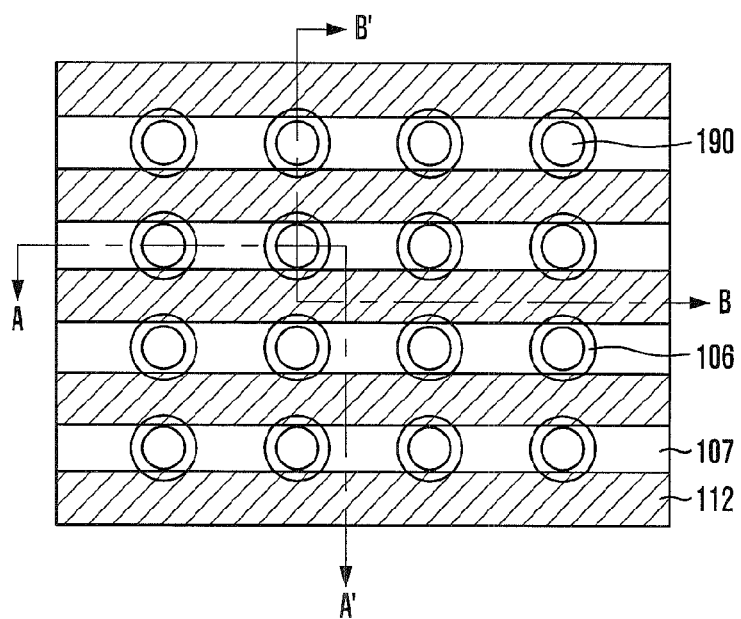
FIGS. 2A to 7C illustrate a method of fabricating a vertical channel transistor in the known semiconductor device.
Figure 2B:
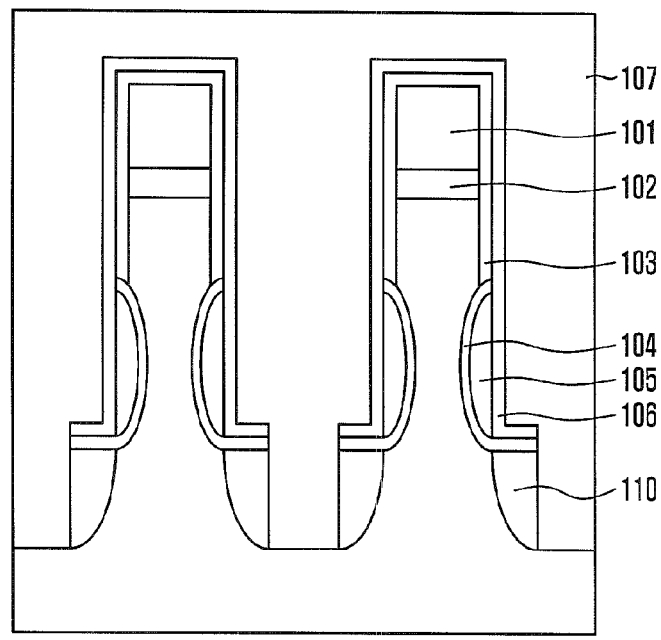
Figure 2C:
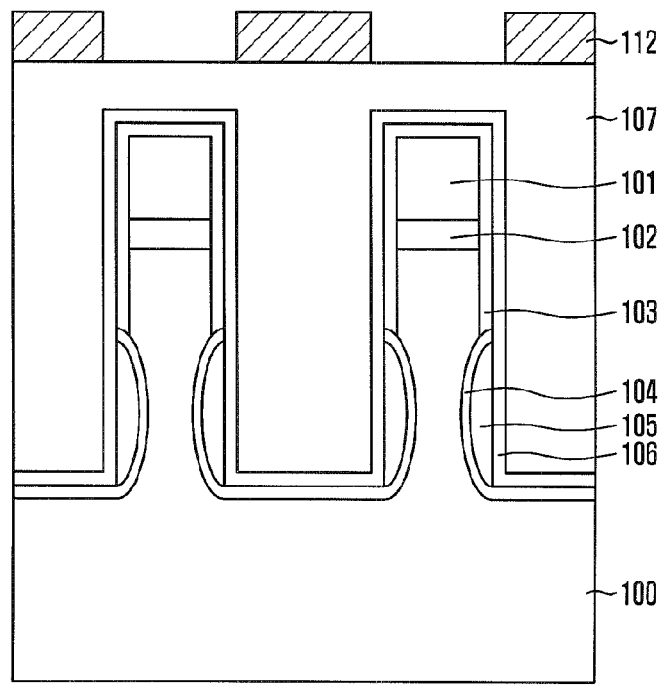
Figure 3A:
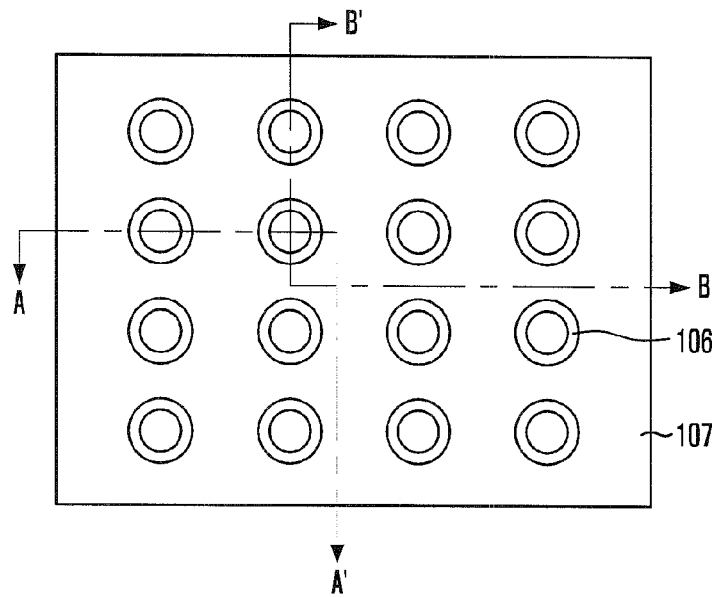
Figure 3B:
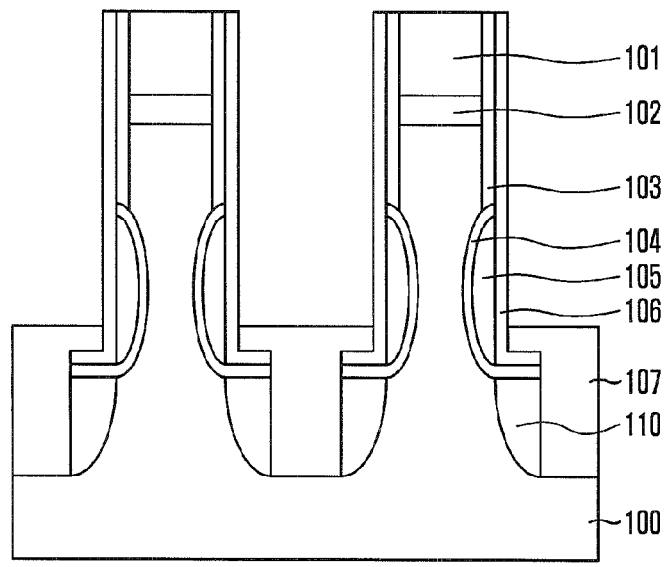
Figure 3C:
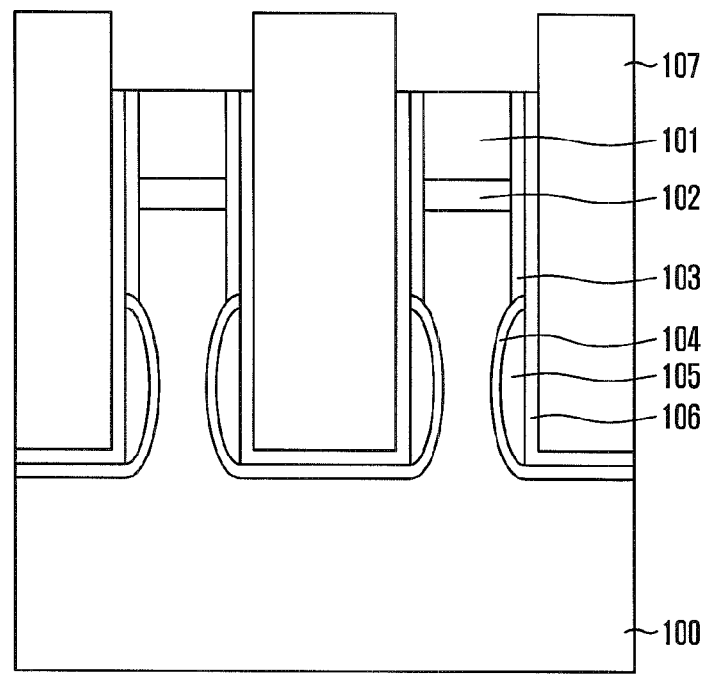
Figure 4A:
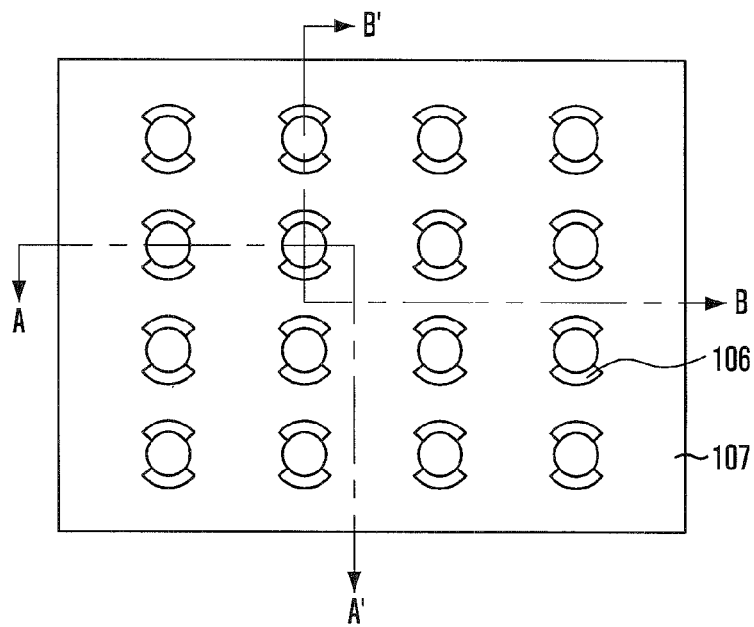
Figure 4B:
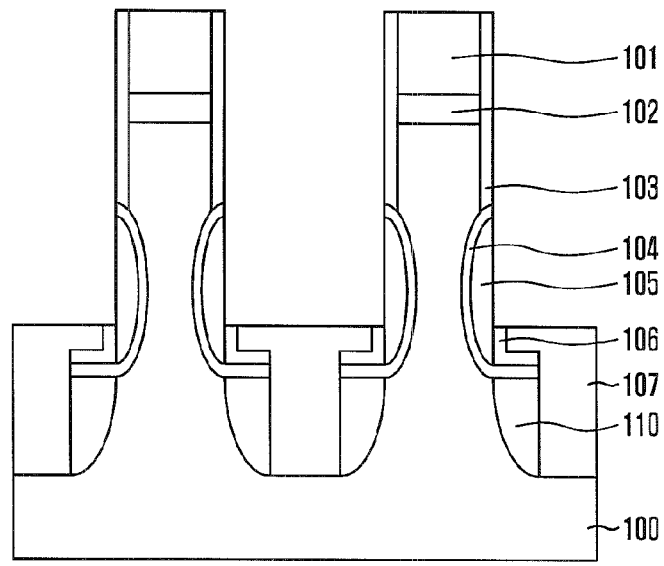
Figure 4C:
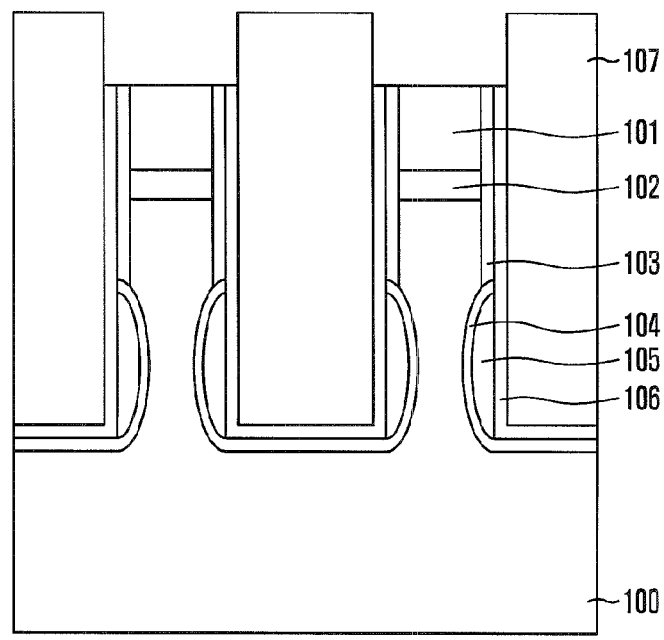
Figure 5A:
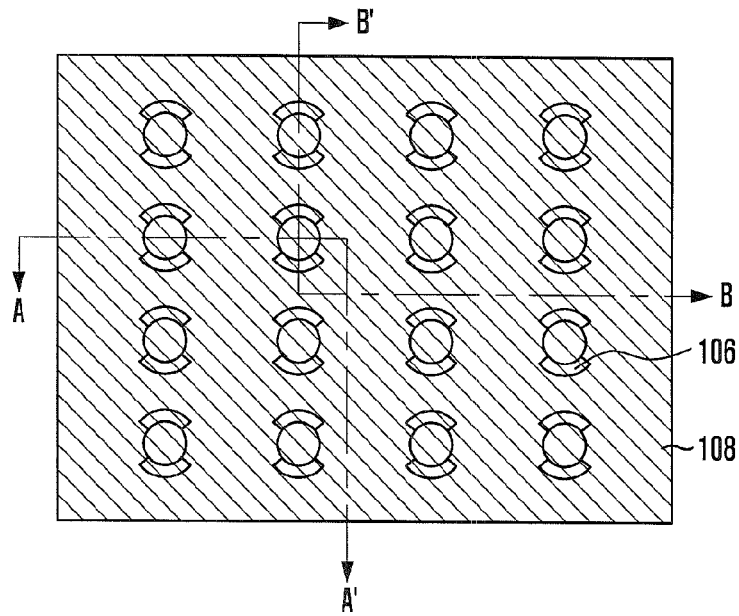
Figure 5B:
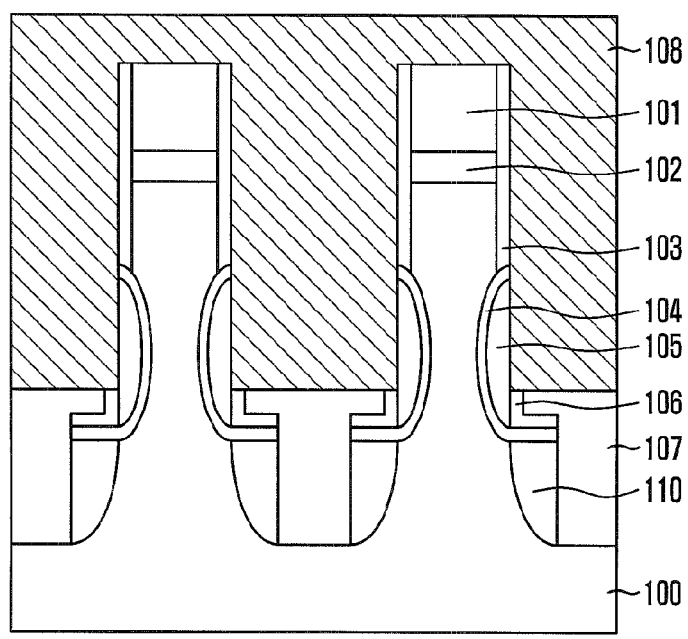
Figure 5C:
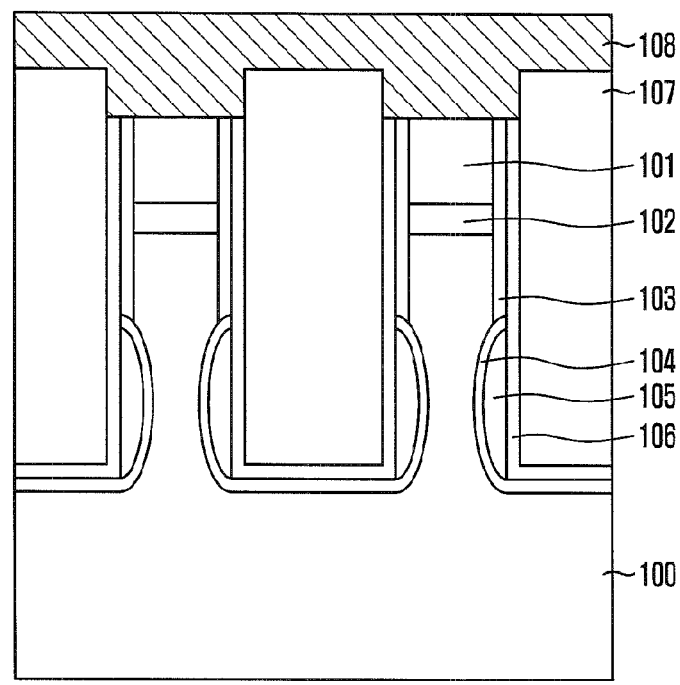
Figure 6A:
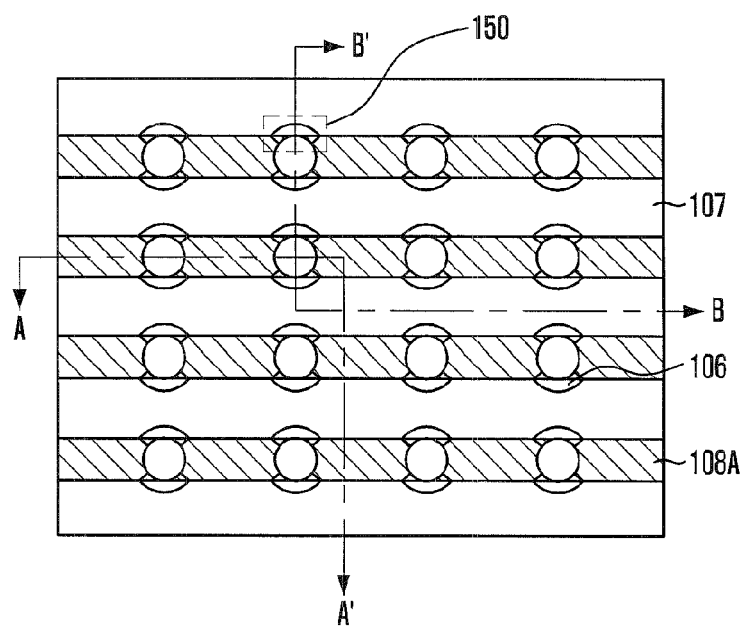
Figure 6B:
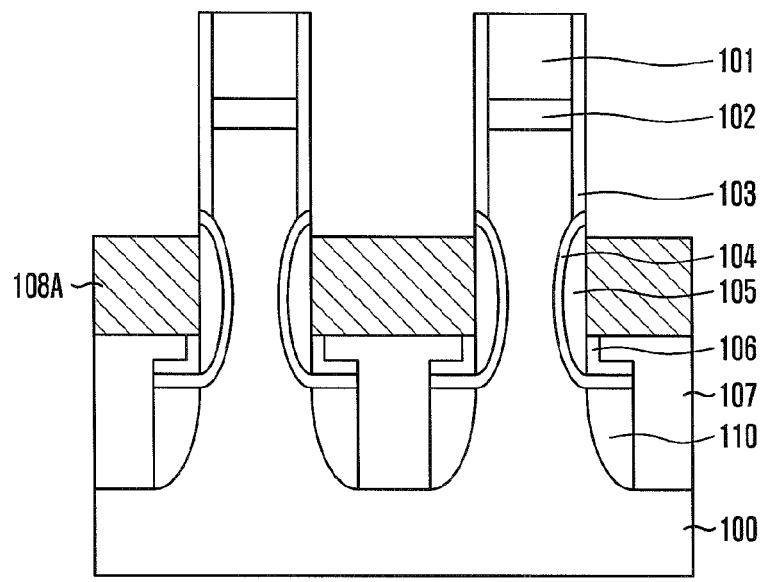
Figure 6C:
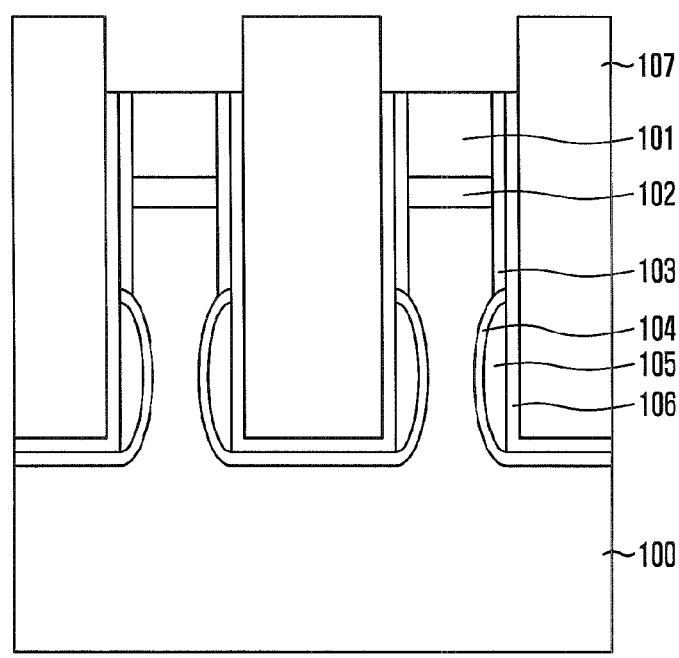
Figure 7A:
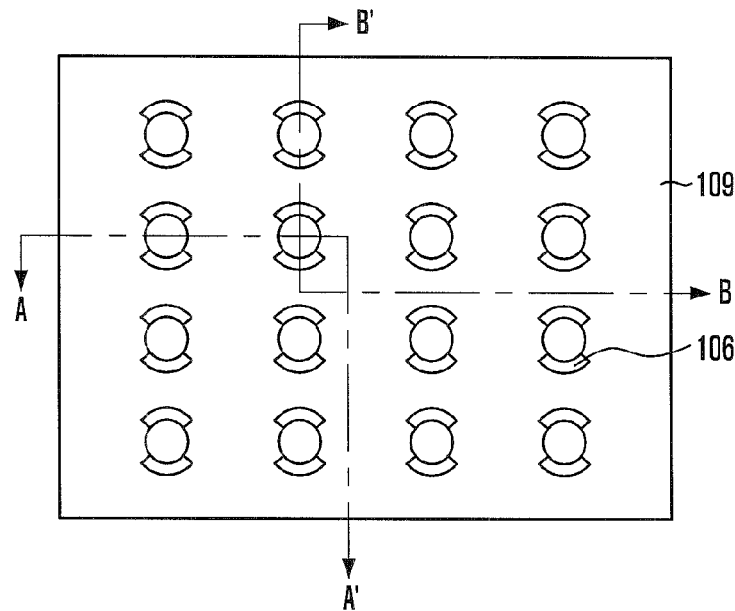
Figure 7B:
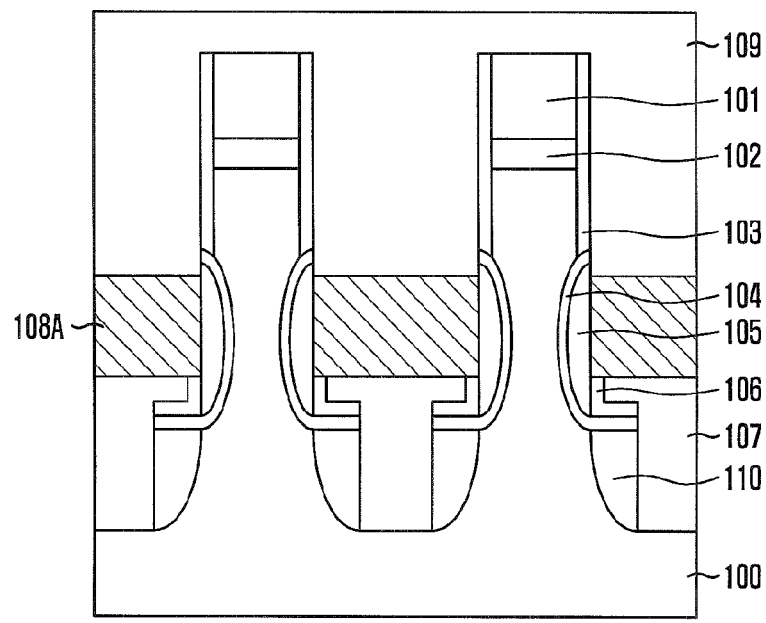
Figure 7C:
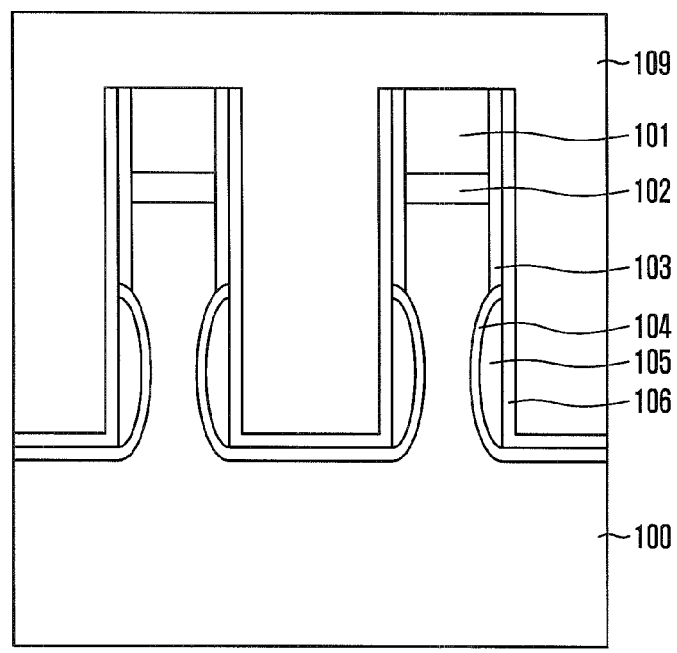

In the method of fabricating the vertical channel transistor as disclosed, potential loss of the hard mask nitride layers 801 can be minimized. In the known method, the first insulation layer 107 is etched by using a mask pattern 112 as an etch mask for a damascene word line patterning process (see FIGS. 2A to 2C). However, since the first insulation layer 807 is etched by performing an etch-back process without a separate mask (see FIGS. 9A to 9C), etch selectivity of the hard mask nitride layer 801 can be improved.

For example, when the first insulation layer 807 is etched by using a plasma, plasma etching is performed under appropriate pressure and appropriate ratio frequency (RF) power using at least a gas selected from $C_4F_6$, Ar and $O_2$. The etching conditions are adjusted by considering the etch selectivity between the first insulation layer 807 and the hard mask nitride layers 801, pressure, and RF power, but the etching profile and the etch selectivity cannot be improved at the same time. As the amount of Ar is increased, the etching profile can be improve, but the etch selectivity of the hard mask nitride layers 801 is deteriorated. In other words, potential loss of the hard mask nitride layers 801 is increased as the amount of Ar in the plasma working gas is increased.

In the known method, since the first insulation layer 107 is etched by a pattern method using a mask, both the etching profile and the etch selectivity of the hard mask nitride layer 101 have to be considered. Also, there is a limitation in improving the etch selectivity between the first insulation layer 107 and the hard mask nitride layer 101, and, as a result, a large amount of the hard mask nitride layer 101 may be damaged during the formation of the word line.

On the other hand, since the first insulation layer 807 and the second insulation layer 811 are etched by using an etch-back process in the disclosed embodiments, there is no need to consider the etching profile. Therefore, the etching-back process is performed under a condition that the first and/or second insulation layers 807 and 811 have maximized etch selectivity with respect to the hard mask nitride layer 801. Accordingly, the potential amount of loss of the hard mask nitride layer 801 can be reduced during the formation of the word line.

Particularly, when the etch-back processes are performed on the first insulation layer 807 and/or the second insulation layer 811 are performed by wet etching, the word line may be formed without damage to the hard mask nitride layers 801.

FIGS. 19A to 24C illustrate a method of fabricating a vertical channel transistor in a semiconductor device in accordance with a second embodiment. FIGS. 19A to 24C illustrate processes corresponding to FIGS. 12A to 17C, respectively. Particularly, FIGS. 19A, 20A, 21A, 22A, 23A and 24A represent plan views of the semiconductor device being fabricated through multiple steps. FIGS. 19B, 20B, 21B, 22B, 23B and 24B represent cross-sectional views of FIGS. 19A, 20A, 21A, 22A, 23A and 24A taken along a cross-sectional line in the first direction A-A', respectively. FIGS. 19C, 20C, 21C, 22C, 23C and 24C represent cross-sectional views of FIGS. 19A, 20A, 21A, 22A, 23A and 24A taken along a cross-sectional line in the second direction B-B', respectively.

Figure 19A:
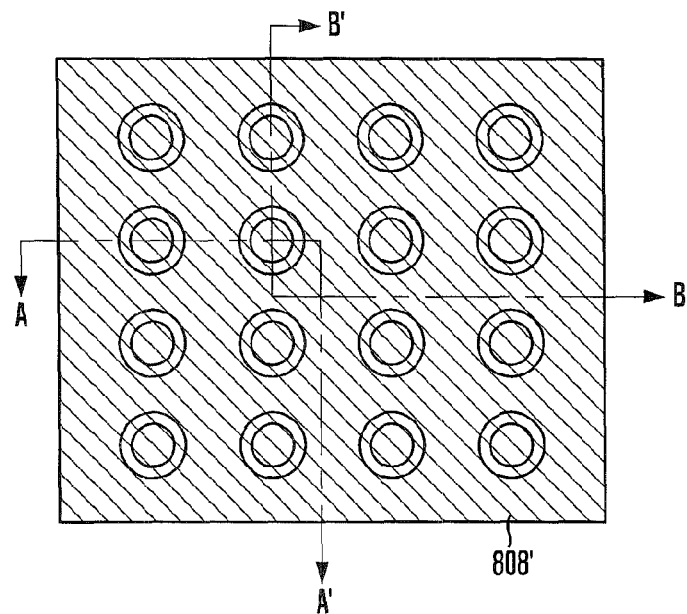
FIGS. 19A to 24C illustrate a method of fabricating a vertical channel transistor in a semiconductor device in accordance with a second embodiment.
Figure 19B:
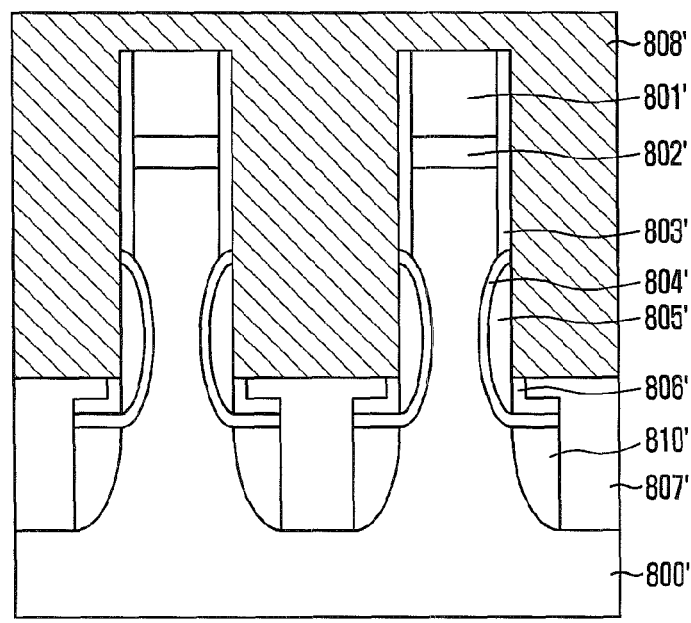
Figure 19C:
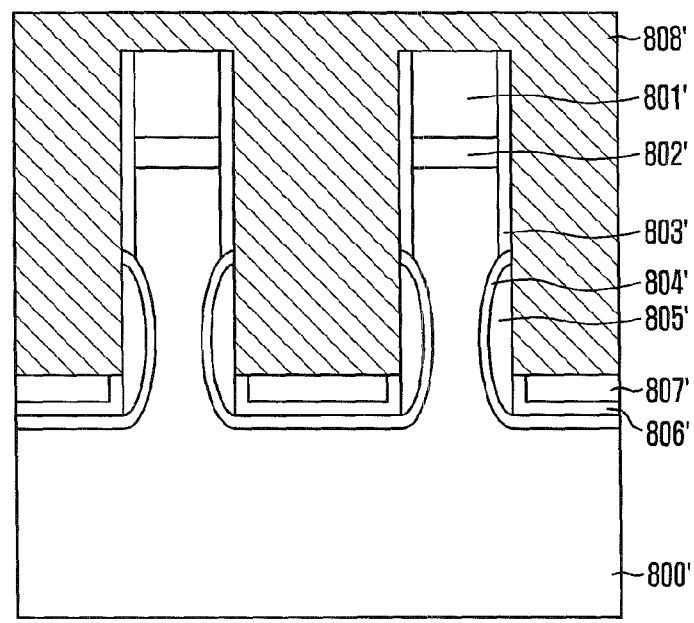

Referring to FIGS. 19A to 19C, a conductive layer (e.g., similar to 808 in Rigs. 11A to 11C) is planarized, without exposing a hard mask nitride layer 801', by reducing the target of the planarization process. The planarized conductive layer is denoted as 808'. Thus, the conductive layer 808' remains on the active pillar, and it can protect the hard mask nitride layers 801' in subsequent processes. The planarization process in some embodiments includes a Chemical Mechanical Polishing (CMP) process.

Figure 20A:
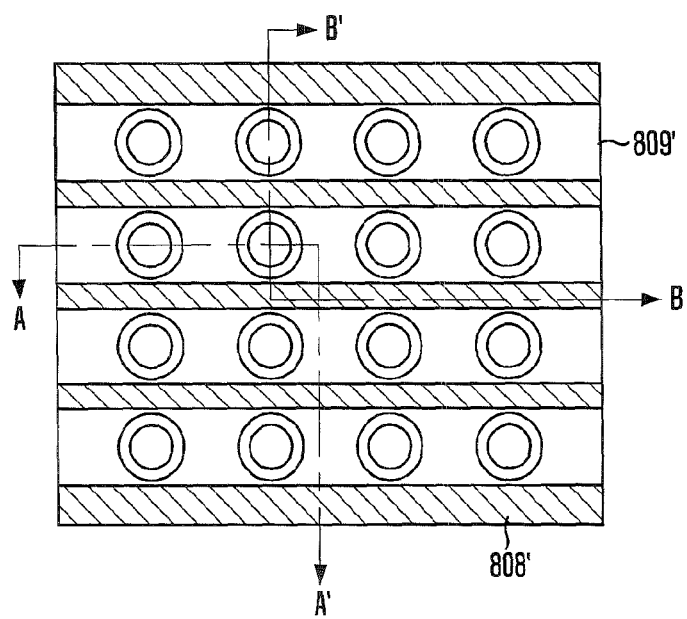
Figure 20B:
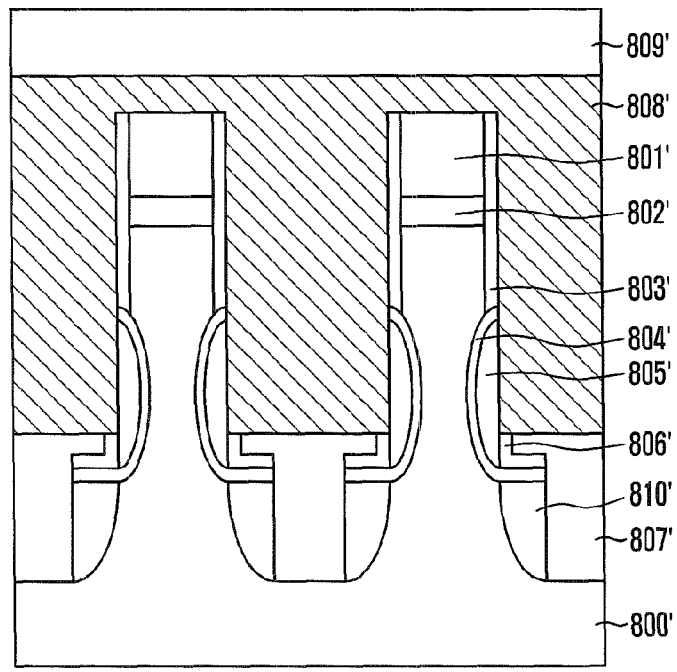
Figure 20C:
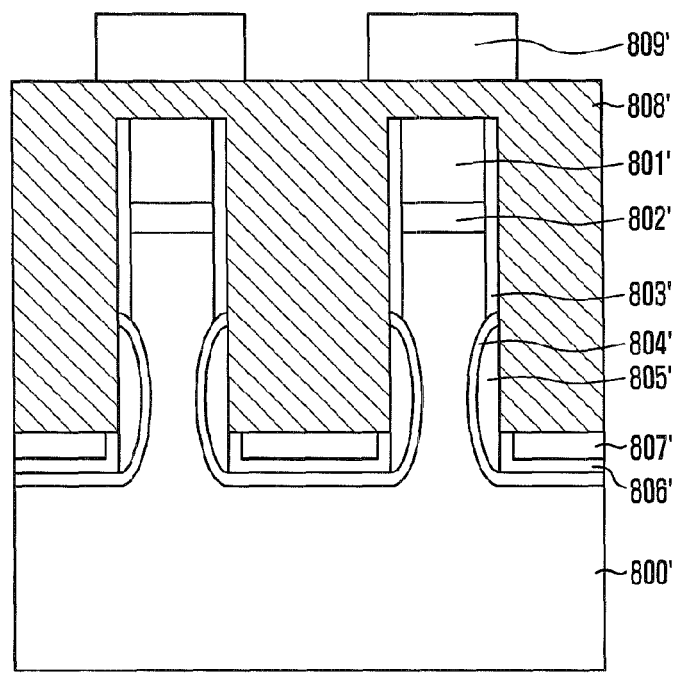

Referring to FIGS. 20A to 20C, a line-type mask pattern 809' covering lines of the active pillars in the first direction is formed over the resultant structure where the planarized conductive layer 808' is formed therein. The mask pattern 809' has a width larger than a diameter of the active pillar.

Figure 21A:
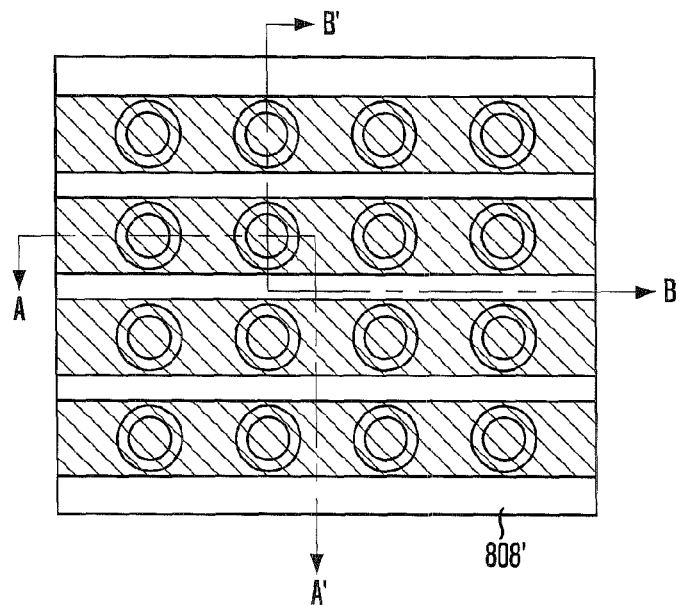
Figure 21B:
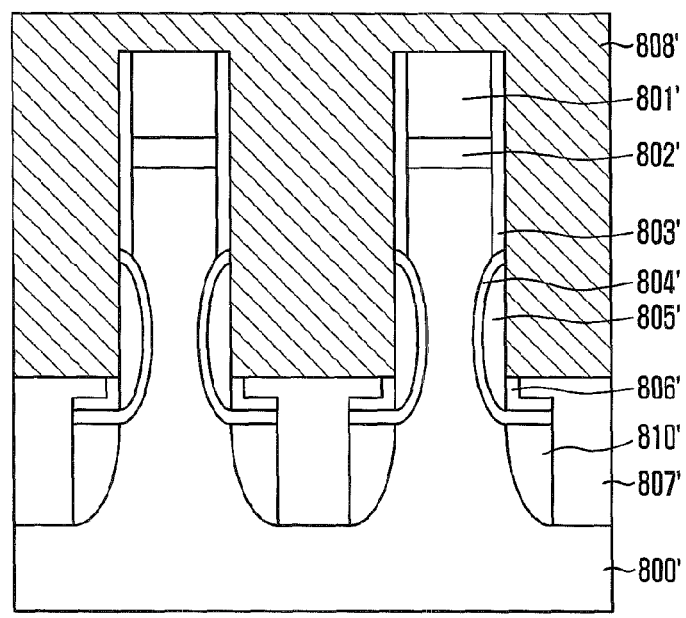
Figure 21C:
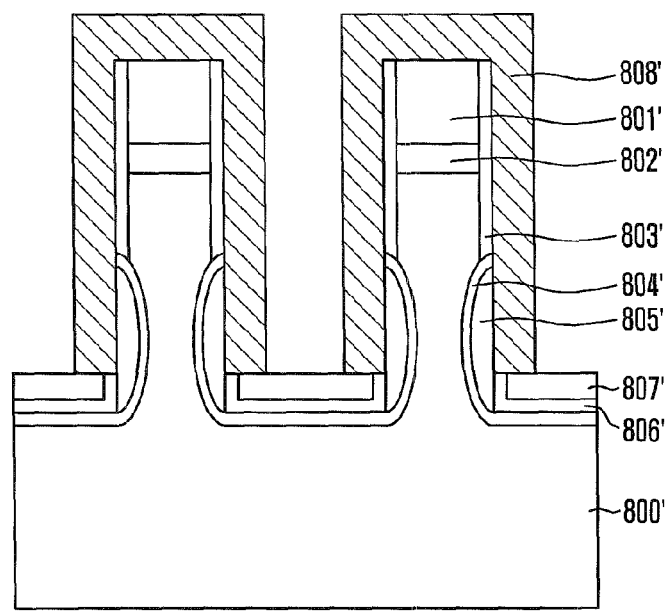

Referring to FIGS. 21A to 21C, the planarized conductive layer 808' is etched using the mask pattern 809' as an etch mask. The etched conductive layer is denoted as 808A'. During the etching process of the planarized conductive layer 808', since the hard mask nitride layer 801' is protected by the mask pattern 809', the hard mask nitride layer 801' may not be damaged.

Figure 22A:
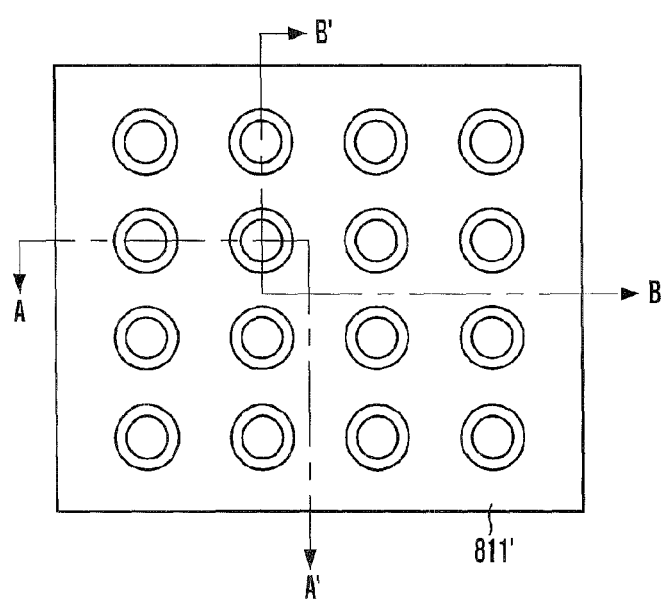
Figure 22B:
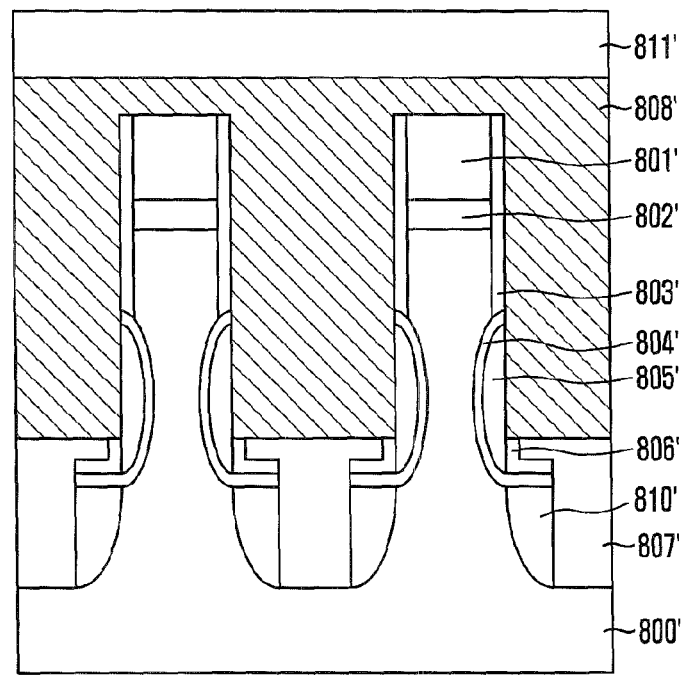
Figure 22C:
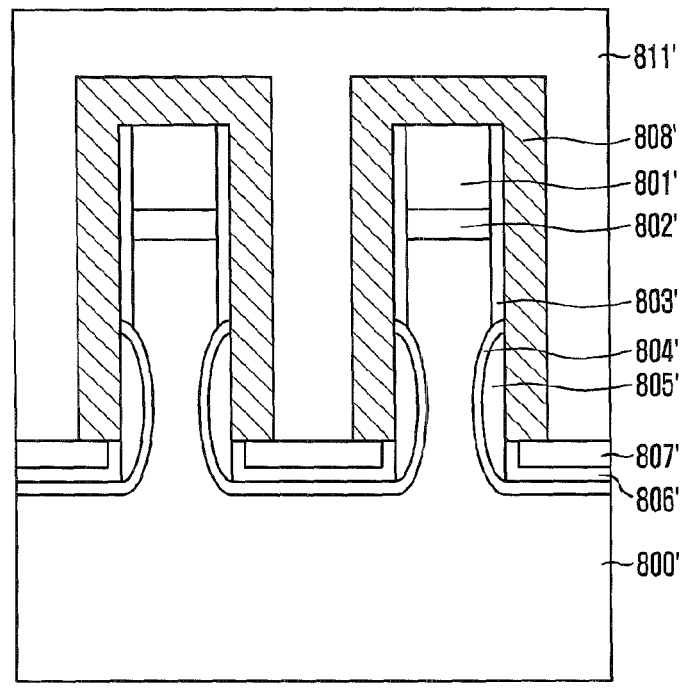

Referring to FIGS. 22A to 22C, a second insulation layer 811' is deposited over the resultant structure to fill the gap region between the active pillars.

Figure 23A:
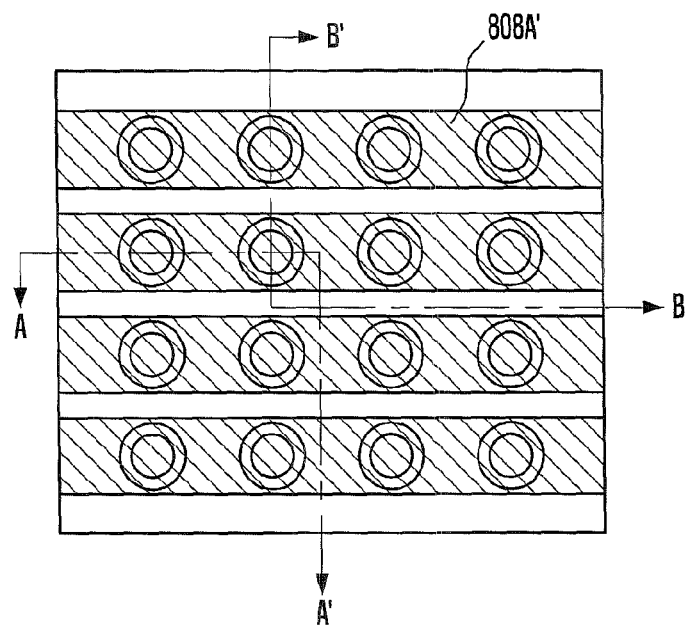
Figure 23B:
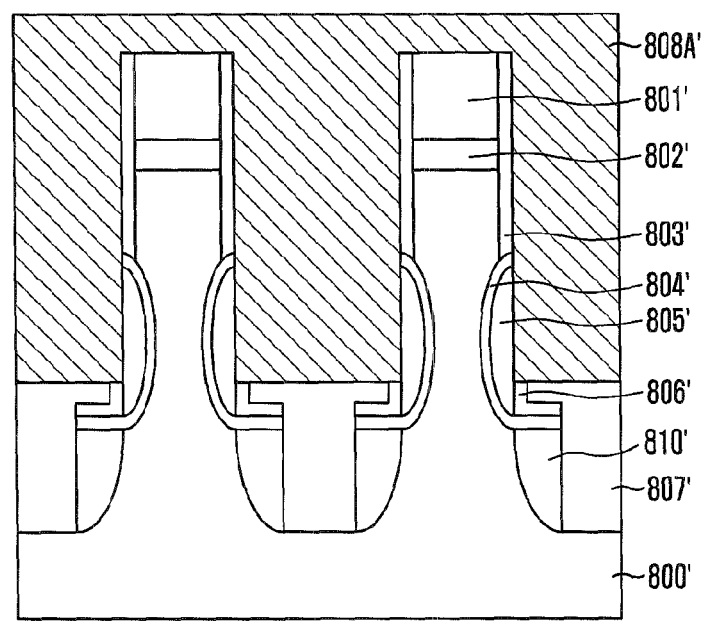
Figure 23C:
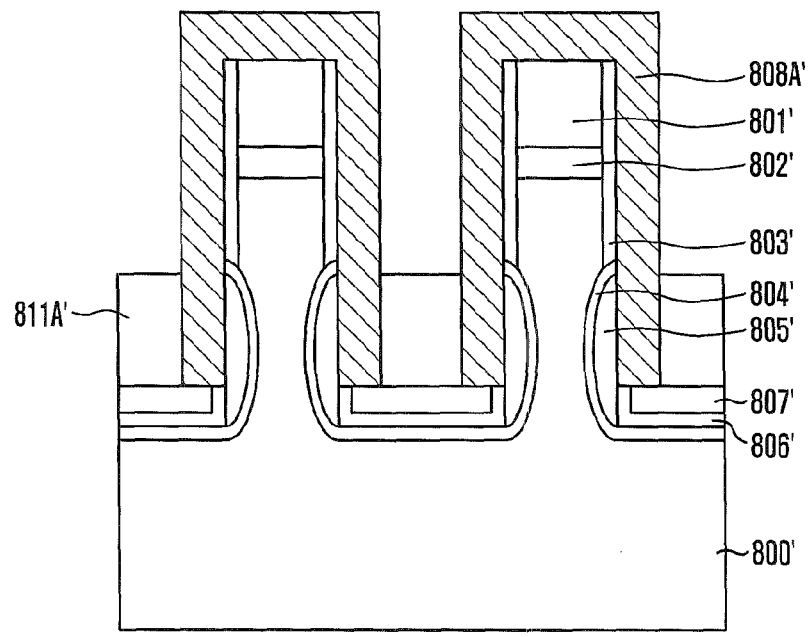

Referring to FIGS. 23A to 23C, an etch-back process is performed on the second insulation layer 811' to a level of the uppermost part of the gate electrode 805'. The etched conductive layer 808A', which covers sidewalls of the upper region of the active pillar, is exposed through the etch-back process of the second insulation layer 811'. During the etch-back process of the second insulation layer 811', since the hard mask nitride layer 801' is protected by the etched conductive layer 808A', the hard mask nitride layer 801' may not be damaged. Hereinafter, the etched second insulation layer is denoted as 811A'.

Figure 24A:
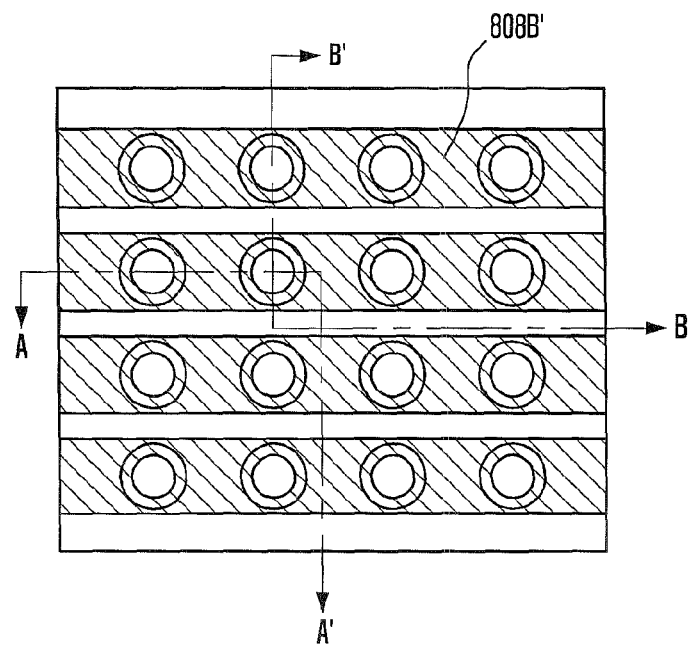
Figure 24B:
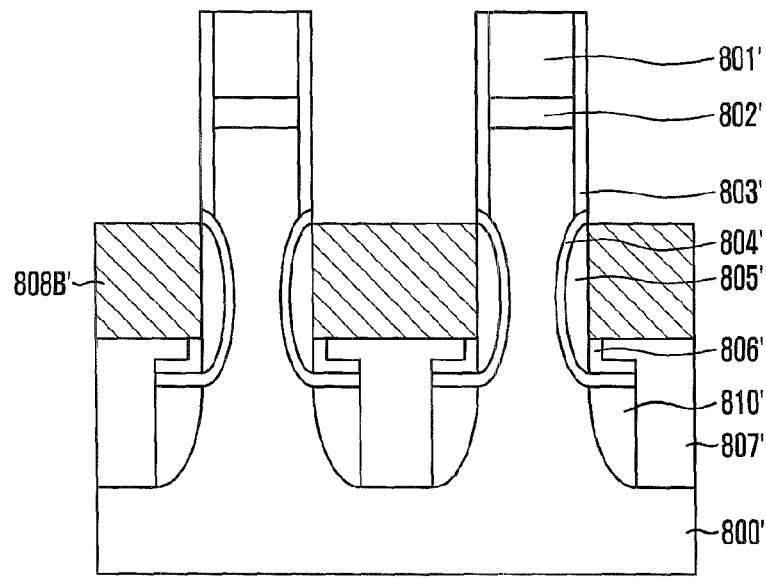
Figure 24C:
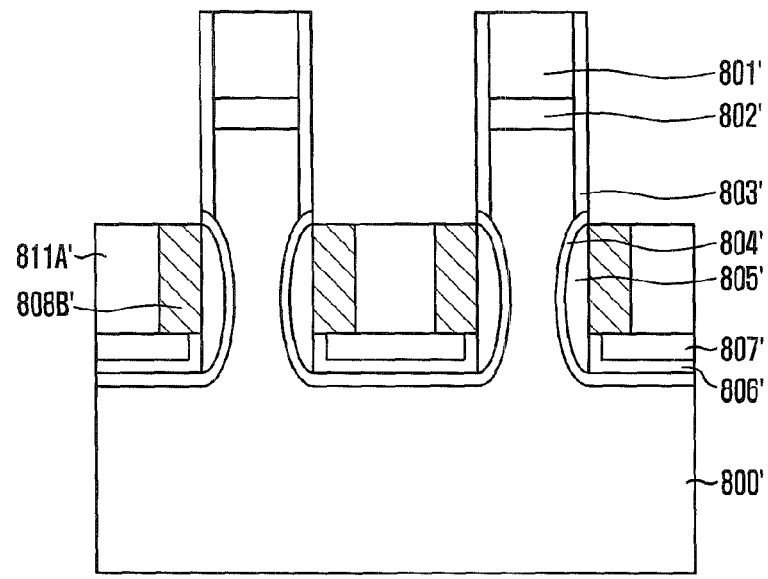

Referring to FIGS. 24A to 24C, an etch-back process is performed on the etched conductive layer 808A' to a level of the uppermost part of the gate electrode 805'. Thus, a conductive line 808B' is formed to define a word line that surrounds and contacts the circumferential surface of the gate electrode 805 in full 360 degrees and extends in the first direction. In some embodiments, the conductive line 808B' surrounds and contacts the whole circumferential surface of the gate electrode 805'.

As described above, the disclosed embodiments can improve characteristics of a semiconductor device by forming a word line that surrounds the whole circumferential surface of a gate electrode surrounding sidewalls of the active pillar and reducing a resistance of the word line.

Also, the disclosed embodiments can minimize a potential loss of the hard mask nitride layer during the word line formation process by performing an etch-back process, rather than a patterning process, on the insulation layer, and by improving etch selectivity between the insulation layer and the hard mask nitride layer. Therefore, structural stability of the active pillar can be increased.

While embodiments have been described, it will be apparent to those skilled in the art that various changes and modifications may be made without departing from the spirit and scope of the present disclosure.

What is claimed is:

1. A semiconductor device having a vertical channel transistor, the device comprising:
   a substrate;
   a plurality of active pillars on the substrate, each said active pillar having a gate electrode formed on and surrounding a lower portion thereof, the active pillars being arranged in a number of rows and columns; and
   a word line extending along one of the rows, and contacting and surrounding, in full 360 degrees, a circumferential surface of the gate electrode of each of the active pillars in the row.

2. The semiconductor device of claim 1, wherein the word line includes any one of a polysilicon and a metal.

3. The semiconductor device of claim 1, wherein the gate electrode includes any one of a polysilicon and a metal.

* * * * *